United States Patent
Endo et al.

(10) Patent No.: US 11,101,008 B2
(45) Date of Patent: Aug. 24, 2021

(54) SEMICONDUCTOR MEMORY DEVICE

(71) Applicant: KIOXIA CORPORATION, Tokyo (JP)

(72) Inventors: Masato Endo, Yokohama Kanagawa (JP); Daisuke Arizono, Yokohama Kanagawa (JP); Yoshikazu Harada, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,684

(22) Filed: Mar. 2, 2020

(65) Prior Publication Data

US 2021/0065823 A1 Mar. 4, 2021

(30) Foreign Application Priority Data

Sep. 2, 2019 (JP) .............................. JP2019-159655

(51) Int. Cl.
*G11C 16/34* (2006.01)
*G11C 16/08* (2006.01)
*G11C 16/04* (2006.01)
*G11C 16/12* (2006.01)
*G11C 16/14* (2006.01)

(52) U.S. Cl.
CPC ........ *G11C 16/349* (2013.01); *G11C 16/0433* (2013.01); *G11C 16/08* (2013.01); *G11C 16/12* (2013.01); *G11C 16/14* (2013.01)

(58) Field of Classification Search
CPC ....... G11C 16/349; G11C 16/14; G11C 16/08; G11C 16/12; G11C 16/0433
USPC ............................................. 365/218, 185.24
See application file for complete search history.

(56) References Cited

U.S. PATENT DOCUMENTS

| 7,652,928 | B2 | 1/2010 | Yanagidaira et al. |
| 9,190,142 | B2 | 11/2015 | Shimura |
| 10,109,353 | B2 | 10/2018 | Ueno et al. |
| 2013/0083600 | A1* | 4/2013 | Lee .................. G11C 16/0483 365/185.12 |
| 2013/0107653 | A1* | 5/2013 | Kwak .................. G11C 16/10 365/218 |
| 2015/0262630 | A1 | 9/2015 | Shirakawa et al. |
| 2016/0005472 | A1* | 1/2016 | Ahn .................. G11C 16/12 365/185.11 |

(Continued)

FOREIGN PATENT DOCUMENTS

JP 2015-176309 A 10/2015

*Primary Examiner* — Michael T Tran
(74) *Attorney, Agent, or Firm* — Foley & Lardner LLP

(57) ABSTRACT

A semiconductor memory device includes a memory transistor, a word line, a peripheral circuit, and electrodes connected to the peripheral circuit. In response to a write command via the electrodes, the peripheral circuit can execute a first program operation of applying a first program voltage to the word line one time when the write command is one of an n1-th write command to an n2-th write command corresponding to the memory transistor; and execute a second program operation of applying a second program voltage to the first word line at least one time when the write command is one of an (n2+1)-th write command to an n3-th write command corresponding to the memory transistor. The second program voltage in a k-th second program operation is less than the first program voltage in a k-th first program operation.

15 Claims, 19 Drawing Sheets

(56) References Cited

U.S. PATENT DOCUMENTS

| | | | |
|---|---|---|---|
| 2016/0071580 A1* | 3/2016 | Takahashi | G11C 11/5628 365/185.03 |
| 2016/0225454 A1* | 8/2016 | Kim | G11C 16/10 |
| 2016/0260484 A1* | 9/2016 | Lim | G11C 16/3459 |
| 2017/0125107 A1* | 5/2017 | Hong | G11C 16/345 |
| 2017/0255564 A1* | 9/2017 | Kitsunai | G06F 11/16 |
| 2017/0271012 A1* | 9/2017 | Park | G11C 16/0483 |
| 2017/0285973 A1* | 10/2017 | Dalmatov | G06F 3/0665 |
| 2017/0286287 A1* | 10/2017 | Hady | G06F 12/0246 |
| 2018/0033492 A1* | 2/2018 | Seo | G11C 16/08 |
| 2018/0211715 A1* | 7/2018 | Oho | G11C 11/5628 |
| 2018/0247680 A1* | 8/2018 | Lee | G11C 16/08 |
| 2018/0277222 A1* | 9/2018 | Kondo | G11C 16/3481 |
| 2018/0277230 A1* | 9/2018 | Date | G11C 16/10 |
| 2019/0043564 A1* | 2/2019 | Madraswala | G11C 16/08 |
| 2019/0115083 A1* | 4/2019 | Lee | G11C 11/5642 |
| 2019/0244674 A1* | 8/2019 | Lee | G11C 16/10 |
| 2019/0272217 A1* | 9/2019 | Lee | G06F 11/0721 |
| 2019/0287635 A1* | 9/2019 | Lee | G11C 16/3404 |
| 2019/0303283 A1* | 10/2019 | McGlaughlin et al. | G06F 3/0616 |
| 2019/0304557 A1* | 10/2019 | Her | G06F 11/1048 |
| 2019/0318792 A1* | 10/2019 | Yang | G11C 16/26 |
| 2019/0333586 A1* | 10/2019 | Park | G06F 3/0679 |
| 2019/0348122 A1* | 11/2019 | Ko | G11C 16/0483 |
| 2019/0348131 A1* | 11/2019 | Watanabe | H01L 27/11573 |
| 2019/0354288 A1* | 11/2019 | Jun | G06F 11/1048 |
| 2019/0354498 A1* | 11/2019 | Ebsen | G06F 9/4837 |
| 2019/0355429 A1* | 11/2019 | Chen | G11C 16/0483 |
| 2019/0392901 A1* | 12/2019 | Lee | G11C 16/26 |
| 2019/0392908 A1* | 12/2019 | Lee | G11C 16/30 |
| 2019/0392909 A1* | 12/2019 | Yang | G11C 16/3459 |
| 2020/0065259 A1* | 2/2020 | Byun | G06F 12/0246 |
| 2020/0066361 A1* | 2/2020 | Ioannou | G11C 16/26 |
| 2020/0066363 A1* | 2/2020 | Yang | G11C 16/3454 |
| 2020/0090760 A1* | 3/2020 | Purahmad | G11C 16/26 |
| 2020/0152272 A1* | 5/2020 | McNeil | G11C 16/08 |

* cited by examiner

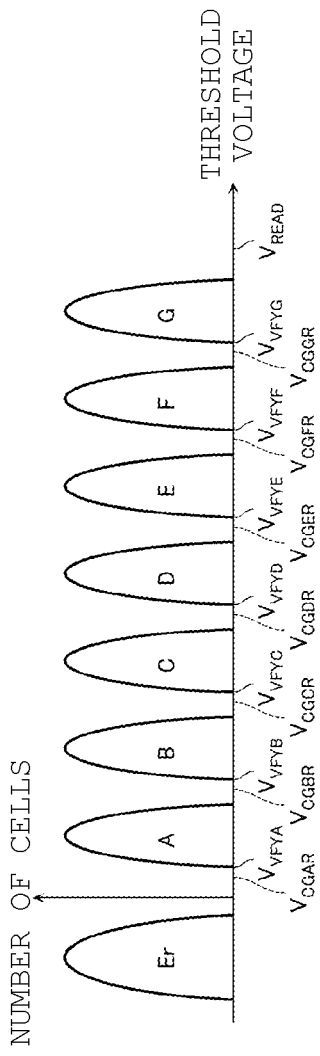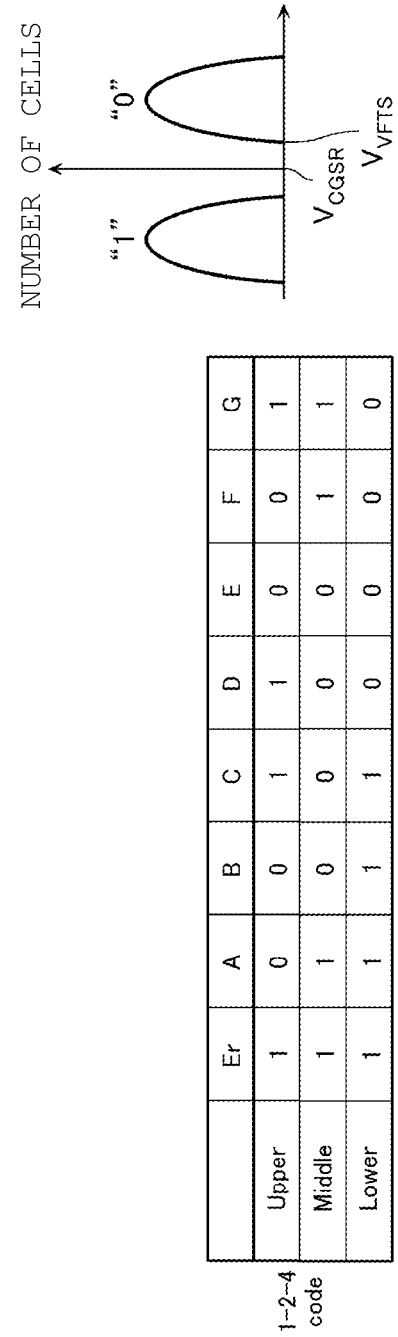
FIG. 11A  FIG. 11B  FIG. 11C  FIG. 11D

| W/E cycle | CMD |
|---|---|
| $0 \sim n_{A11}$ | CMD1 |
| $n_{A11}+1 \sim n_{A12}$ | CMD2 |
| $n_{A12}+1 \sim n_{A13}$ | CMD3 |

| CMD | V |
|---|---|
| CMD1 | $V_{PGM1}+\Delta V$ |
| CMD2 | $V_{PGM2}+\Delta V$ |
| CMD3 | $V_{PGM3}+\Delta V$ |

| CMD | V |
|---|---|
| CMD1 | $V_{PGM1}+\Delta V_1$ |
| CMD2 | $V_{PGM2}+\Delta V_2$ |
| CMD3 | $V_{PGM3}+\Delta V_3$ |

43

| CMD | V |
|---|---|
| CMD1 | $V_{PGM11}+\Delta V_{11}$ (WL0~WLa)<br>$V_{PGM12}+\Delta V_{12}$ (WLa~WLb)<br>$V_{PGM13}+\Delta V_{13}$ (WLb~WLc) |
| CMD2 | $V_{PGM21}+\Delta V_{21}$ (WL0~WLa)<br>$V_{PGM22}+\Delta V_{22}$ (WLa~WLb)<br>$V_{PGM23}+\Delta V_{23}$ (WLb~WLc) |
| CMD3 | $V_{PGM31}+\Delta V_{31}$ (WL0~WLa)<br>$V_{PGM32}+\Delta V_{32}$ (WLa~WLb)<br>$V_{PGM33}+\Delta V_{33}$ (WLb~WLc) |

43

| W/E cycle | V |
|---|---|
| $0 \sim n_{A11}$ | $V_{PGM1} + \Delta V_1$ |
| $n_{A11}+1 \sim n_{A12}$ | $V_{PGM2} + \Delta V_2$ |
| $n_{A12}+1 \sim n_{A13}$ | $V_{PGM3} + \Delta V_3$ |

44

| W/E cycle | V |
|---|---|
| $0 \sim n_{A11}$ | Cmd1 |
| $n_{A11}+1 \sim n_{A12}$ | Cmd2 |
| $n_{A12}+1 \sim n_{A13}$ | Cmd3 |

45

| Cmd | CMD |
|---|---|
| Cmd1 | CMD1 |
| Cmd2 | CMD2 |
| Cmd3 | CMD3 |

46

SEMICONDUCTOR MEMORY DEVICE

CROSS-REFERENCE TO RELATED APPLICATION(S)

This application is based upon and claims the benefit of priority from Japanese Patent Application No. 2019-159655, filed Sep. 2, 2019, the entire contents of which are incorporated herein by reference.

FIELD

Embodiments described herein relate generally to a semiconductor memory device.

BACKGROUND

A semiconductor memory device is known that includes a memory transistor, a word line connected to a gate electrode of the memory transistor, and a peripheral circuit connected to the word line.

Examples of related art include JP-A 2015-176309.

DESCRIPTION OF THE DRAWINGS

FIGS. 11A to 11D are schematic diagrams for illustrating data recorded in the memory cell MC;

DETAILED DESCRIPTION

Figure 1:
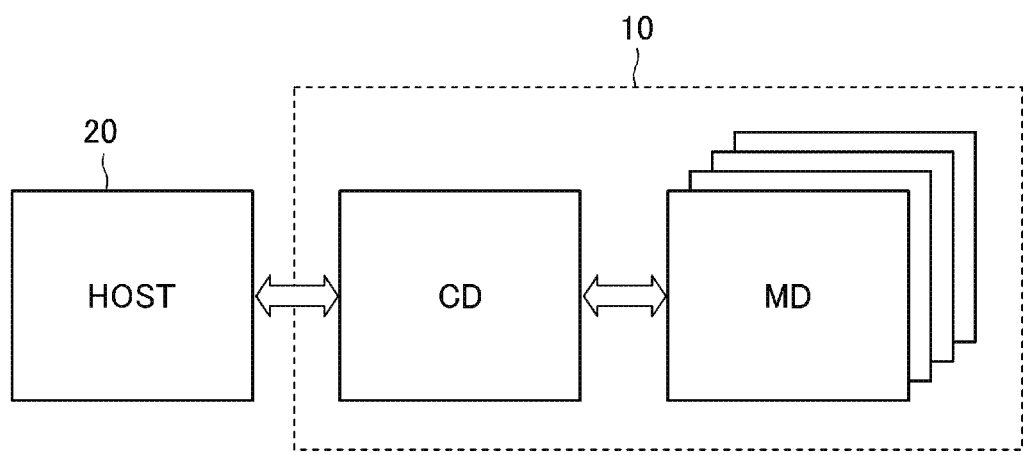
FIG. 1 is a schematic block diagram showing a configuration of a memory system 10.

Embodiments provide a semiconductor memory device having a long lifespan and high speed.

In general, according to one embodiment, a semiconductor memory device includes a first memory transistor having a gate electrode, a word line connected to the gate electrode of the memory transistor, a peripheral circuit connected to the first word line, and a plurality of electrodes connected to the peripheral circuit and configured to receive data input and provide data output. In response to a write command via the plurality of electrodes, the peripheral circuit can execute a first write sequence including a first program operation of applying a first program voltage to the first word line at least one time when the write command is one of an n1-th write command to an n2-th write command corresponding to the memory transistor. Each of the n1 and n2 is a natural number, and n2 is greater than n1; and execute a second write sequence including a second program operation of applying a second program voltage to the first word line at least one time when the write command is one of an (n2+1)-th write command to an n3-th write command corresponding to the memory transistor. n3 is a natural number greater than n2. The corresponding second program voltage in a k-th one of the second program operations of the second write sequence is less than the corresponding first program voltage in a k-th one of the first program operations in the first write sequence. k is a natural number. The second program voltage in the k-th (k is a natural number) second program operation of the second write sequence is smaller than the first program voltage in the k-th first program operation of the first write sequence.

In general, according to one embodiment, a semiconductor memory device includes a memory transistor, a word line connected to a gate electrode of the memory transistor, a peripheral circuit connected to the word line, and a plurality of electrodes connected to the peripheral circuit and usable for data input and output. In response to the input of a first write command through the plurality of electrodes, the peripheral circuit executes a first write sequence in which a first program operation for transferring a first program voltage to the word line is executed once or a plurality of times. In response to the input of a second write command through the plurality of electrodes, the peripheral circuit executes a second write sequence in which a second program operation for transferring a second program voltage to the word line is executed once or a plurality of times. The second program voltage in the k-th (k is a natural number) second program operation of the second write sequence is smaller than the first program voltage in the k-th first program operation of the first write sequence.

Next, a semiconductor memory device according to embodiments will be described in detail with reference to the drawings. The following embodiments are merely examples, and are not intended to limit the present disclosure.

In the specification, the term "semiconductor memory device" may mean a memory die, or a memory system including a control die, such as a memory chip, a memory card, an SSD, or the like. The term may mean a configuration including a host computer, such as a smartphone, a tablet terminal, a personal computer, or the like.

In the specification, when a first configuration is said to be "electrically connected" to a second configuration, the first configuration may be directly connected to the second configuration, or the first configuration may be connected to the second configuration via a wiring, a semiconductor member, a transistor, or the like. For example, when three transistors are connected in series, the first transistor is "electrically connected" to the third transistor even if the second transistor is in the OFF state.

In the specification, when a first configuration is said to be "connected between" a second configuration and a third configuration, the first configuration, the second configuration, and the third configuration are connected in series and the first configuration may be provided in the current path of the second configuration and the third configuration.

In the specification, when a circuit or the like is said to "conduct" two wirings or the like, for example, the circuit or the like includes a transistor or the like, and the transistor or the like is provided with a current path between the two wirings, and then, the transistor or the like is turned on.

First Embodiment

[Memory System 10]

FIG. 1 is a schematic block diagram showing a configuration of a memory system 10 according to a first embodiment.

The memory system 10 reads, writes, and erases user data according to signals transmitted from a host computer 20. The memory system 10 is, for example, a memory chip, a memory card, an SSD, or other systems capable of storing user data. The memory system 10 includes a plurality of memory dies MD for storing user data, and a control die CD connected to the plurality of memory dies MD and the host computer 20. The control die CD includes, for example, a processor, a RAM, a ROM, an ECC circuit, and the like, and performs processing such as conversion between a logical address and a physical address, bit error detection and correction, wear leveling, and the like.

Figure 2:
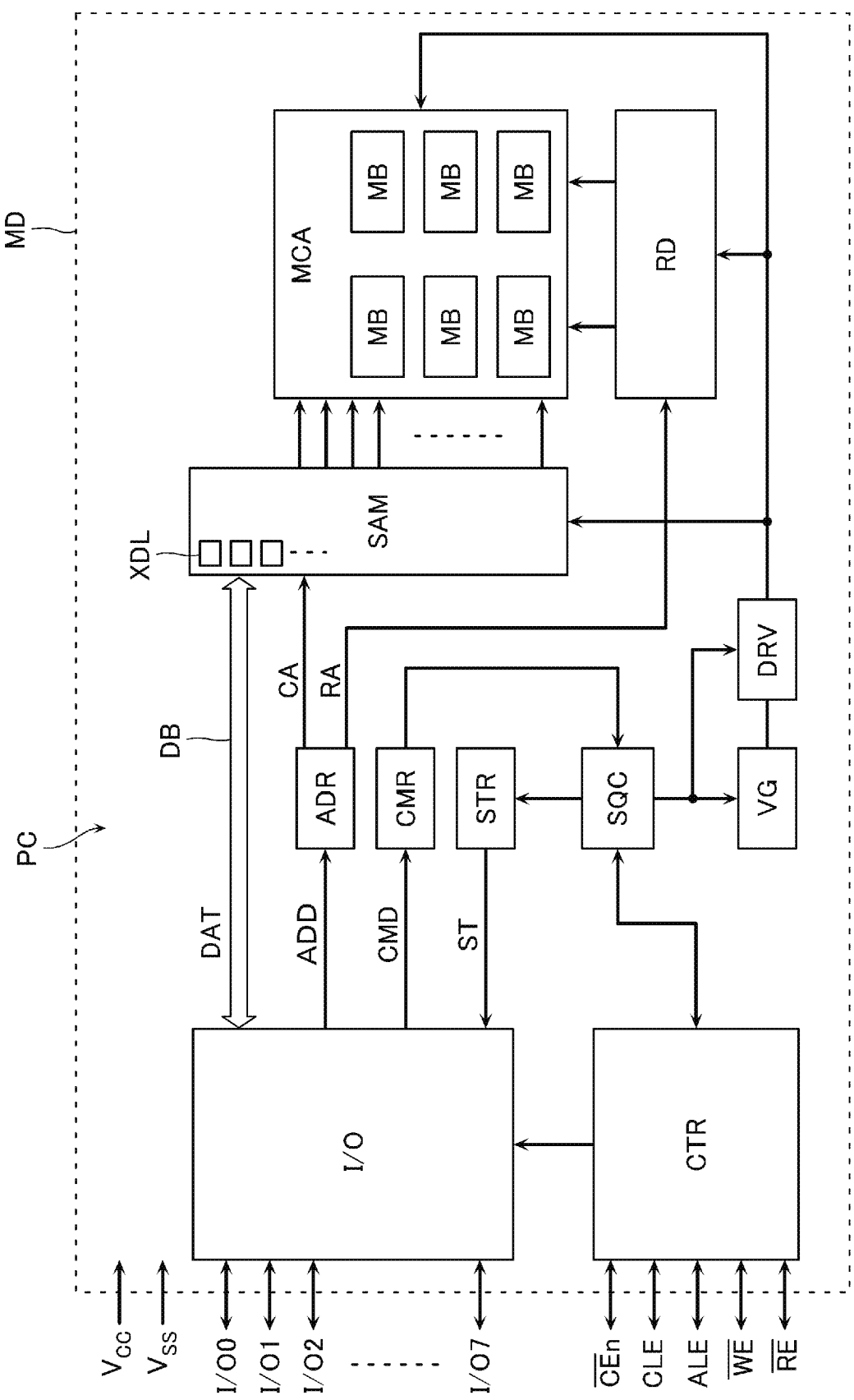
FIG. 2 is a schematic block diagram showing a configuration of a memory die MD.

FIG. 2 is a schematic block diagram showing a configuration of the memory die MD according to the first embodiment. FIGS. 3 to 6 are schematic circuit diagrams showing a partial configuration of the memory die MD.

As shown in FIG. 2, the memory die MD includes a memory cell array MCA for storing data, and a peripheral circuit PC connected to the memory cell array MCA.

[Memory Cell Array MCA]

Figure 3:
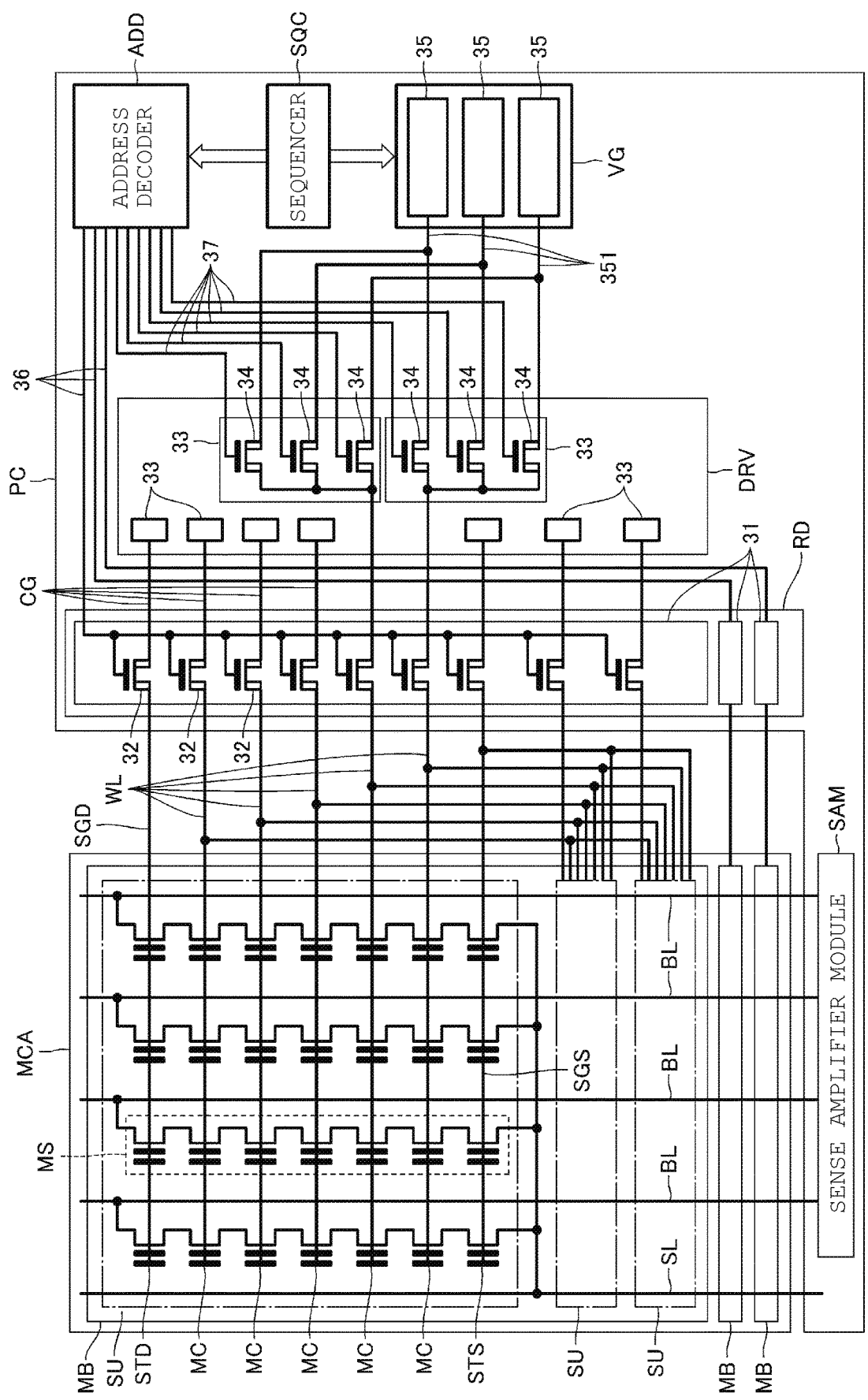
FIG. 3 is a schematic circuit diagram showing a configuration of a memory cell array MCA.

The memory cell array MCA includes a plurality of memory blocks MB. Each of the plurality of memory blocks MB includes a plurality of string units SU as shown in FIG. 3. Each of the plurality of string units SU includes a plurality of memory strings MS. One ends of the plurality of memory strings MS are each connected to the peripheral circuit PC via a bit line BL. Further, the other ends of the plurality of memory strings MS are each connected to the peripheral circuit PC via a common source line SL.

The memory string MS includes a drain select transistor STD, a plurality of memory cells MC, and a source select transistor STS connected in series between the bit line BL and the source line SL. Hereinafter, the drain select transistor STD and the source select transistor STS may be simply referred to as a select transistor (STD, STS).

The memory cell MC according to the present embodiment is a field effect transistor (memory transistor) including a semiconductor layer functioning as a channel region, a gate insulating film including a charge storage film, and a gate electrode. The threshold voltage of the memory cell MC changes according to the amount of charge in the charge storage film. The memory cell MC stores 1-bit or multiple-bit data. A word line WL is connected to each of the gate electrodes of the plurality of memory cells MC corresponding to one memory string MS. Each of these word lines WL is commonly connected to all the memory strings MS in one memory block MB.

The select transistor (STD, STS) is a field effect transistor including a semiconductor layer functioning as a channel region, a gate insulating film, and a gate electrode. Select gate lines (SGD, SGS) are connected to the gate electrodes of the select transistors (STD, STS), respectively. The drain selection line SGD is provided in correspondence to the string unit SU, and is commonly connected to all the memory strings MS in one string unit SU. The source selection line SGS is commonly connected to all the memory strings MS in one memory block MB.

[Peripheral Circuit PC]

As shown in FIG. 2, the peripheral circuit PC includes a sense amplifier module SAM, a row decoder RD, a driver DRV, a voltage generation circuit VG, an address decoder ADD (FIG. 3), and a sequencer SQC. The peripheral circuit PC includes an address register ADR, a command register CMR, and a status register STR. The peripheral circuit PC includes an input and output control circuit I/O and a logic circuit CTR.

The sense amplifier module SAM includes a plurality of sense amplifier units corresponding to the plurality of bit lines BL. The sense amplifier unit includes a sense amplifier connected to the bit line BL, a data bus connected to the sense amplifier, and a plurality of latch circuits connected to the data bus. The sense amplifier includes a sense transistor connected between the data bus and the ground terminal. For example, the sense transistor discharges the data bus according to the current flowing through the bit line BL. The gate electrode of the sense transistor is connected to the bit line BL via a sense node and a clamp transistor. The sense amplifier includes a decode circuit that selectively connects the bit line BL to a first voltage supply line or a second voltage supply line according to the value latched by the latch circuit in the sense amplifier unit.

For example, as shown in FIG. 3, the row decoder RD includes a plurality of block selection units 31 corresponding to the memory blocks MB. Each of the plurality of block selection units 31 includes a plurality of block select transistors 32 corresponding to the word line WL and the select gate line (SGD, SGS). The block select transistor 32 is, for example, a field effect type breakdown voltage transistor. One ends of each block select transistors 32 are each electrically connected to the corresponding word line WL or select gate line (SGD, SGS). The other ends are each electrically connected to the wiring CG. The gate electrode is commonly connected to the corresponding block selection line 36.

The driver DRV includes a plurality of voltage selection units 33 corresponding to the word lines WL and select gate lines (SGD, SGS). Each of the plurality of voltage selection units 33 includes a plurality of voltage select transistors 34. The voltage select transistor 34 is, for example, a field effect type breakdown voltage transistor. One ends of the voltage select transistors 34 are each electrically connected to the corresponding word line WL or select gate line (SGD, SGS) via the wiring CG and the row decoder RD. The other ends thereof are each electrically connected to the corresponding operating voltage output terminal 351. Each gate electrode is connected to the corresponding voltage selection line 37.

The voltage generation circuit VG includes a plurality of operating voltage generation units 35. The plurality of operating voltage generation units 35 are connected to, for example, power supply voltage supply terminals $V_{CC}$ and $V_{SS}$. Each of the plurality of operation voltage generation units 35 sequentially generates operating voltages applied to the bit line BL, the source line SL, the word line WL, and the select gate line (SGD, SGS) in a read operation, a write operation, and an erase operation with respect to the memory cell array MCA according to a control signal from the sequencer SQC, and outputs the operating voltages to a plurality of operation voltage output terminals 351.

The address decoder ADD includes a plurality of block selection lines 36 and a plurality of voltage selection lines 37. For example, the address decoder ADD sequentially refers to the address data in the address register ADR (FIG. 2) according to the control signal from the sequencer SQC, decodes the address data, sets a predetermined block selection line 36 and voltage selection line 37 corresponding to the address data to the "H" state, and sets the other block selection lines 36 and voltage selection lines 37 to the "L" state.

The sequencer SQC sequentially decodes the command CMD stored in the command register CMR (FIG. 2), and outputs an internal control signal to the sense amplifier module SAM, the row decoder RD, the driver DRV, and the voltage generation circuit VG. The sequencer SQR appropriately outputs status data indicating its own state to the status register STR (FIG. 2). For example, when the write sequence or the erase sequence is executed, information indicating whether the write sequence or the erase sequence is normally completed is output as status data.

The input and output control circuit I/O includes data input and output terminals I/O0 to I/O7, a shift register connected to the data input and output terminals I/O0 to I/O7, and a FIFO buffer connected to the shift register. The input and output control circuit I/O outputs the data input from the data input and output terminals I/O0 to I/O7 to the latch circuit XDL in the sense amplifier module SAM, the address register ADR or the command register CMR, according to the internal control signal from the logic circuit CTR. The data input from the latch circuit XDL or the status register STR is output to the data input and output terminals I/O0 to I/O7.

The logic circuit CTR receives an external control signal from the control die CD via external control terminals /CEn, CLE, ALE, /WE, and /RE, and outputs an internal control signal to the input and output control circuit I/O accordingly.

Figure 4:
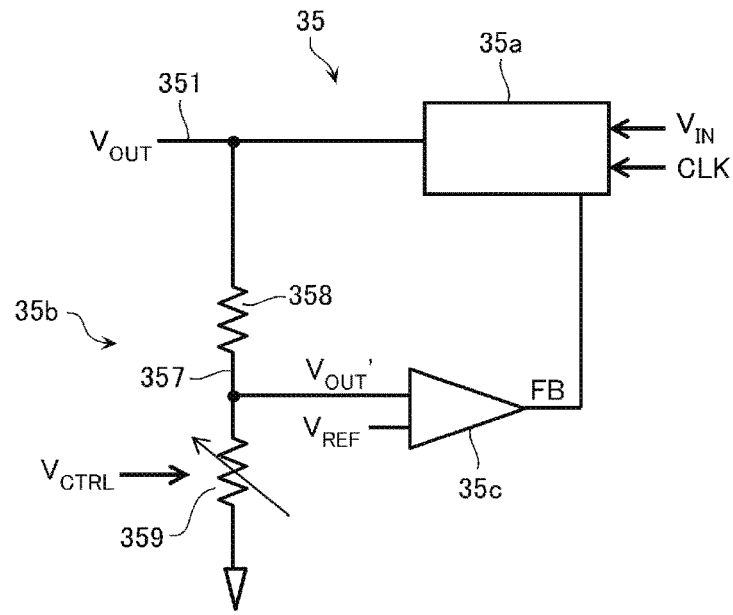
FIG. 4 is a schematic equivalent circuit diagram showing a configuration of an operating voltage generation unit 35.
Figure 5:
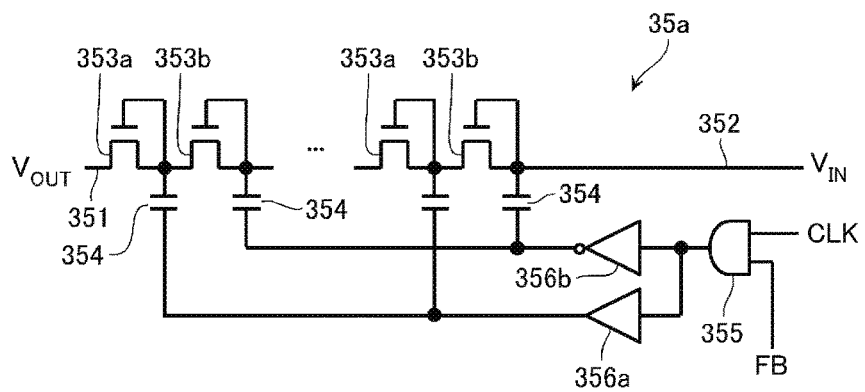
FIG. 5 is a schematic equivalent circuit diagram showing a configuration of the operating voltage generation unit 35.
Figure 6:
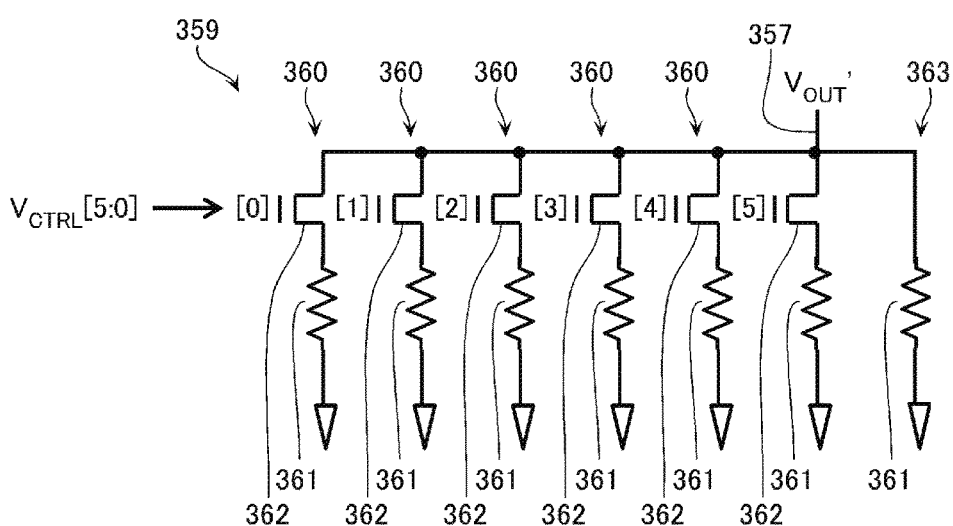
FIG. 6 is a schematic equivalent circuit diagram showing a configuration of the operating voltage generation unit 35.

FIGS. 4 to 6 are schematic equivalent circuit diagrams showing a configuration of the operating voltage generation unit 35.

As shown in FIG. 4, the operating voltage generation unit 35 includes a booster circuit 35a that outputs a voltage $V_{OUT}$ to the operating voltage output terminal 351, a voltage dividing circuit 35b connected to the operating voltage output terminal 351, and a comparator 35c that outputs a feedback signal FB to the booster circuit 35a according to the magnitude relationship between the voltage $V_{OUT}'$ output from the voltage dividing circuit 35b and a reference voltage $V_{REF}$.

As shown in FIG. 5, the booster circuit 35a includes a plurality of transistors 353a and 353b that are alternately connected between a power supply voltage input terminal 352 and the operating voltage output terminal 351. The power supply voltage input terminal 352 is connected to the power supply voltage supply terminal $V_{CC}$ and is supplied with the power supply voltage. The gate electrodes of the plurality of transistors 353a and 353b connected in series are connected to the respective drain electrodes and capacitors 354. The booster circuit 35a includes an AND circuit 355 that outputs a logical sum of the clock signal CLK and the feedback signal FB, a level shifter 356a that boosts and outputs the output signal of the AND circuit 355, and a level shifter 356b that boosts and outputs the inverted signal of the output signal of the AND circuit 355. The output signal of the level shifter 356a is connected to the gate electrode of the transistor 353a through the capacitor 354. The output signal of the level shifter 356b is connected to the gate electrode of the transistor 353b through the capacitor 354.

When the feedback signal FB is in the "H" state, the AND circuit 355 outputs the clock signal CLK. Accordingly, electrons are transferred from the operating voltage output terminal 351 to the power supply voltage input terminal 352, and the voltage of the operating voltage output terminal 351 increases. On the other hand, when the feedback signal FB is in the "L" state, the AND circuit 355 does not output the clock signal CLK. Therefore, the voltage at the operating voltage output terminal 351 does not increase.

The voltage dividing circuit 35b (FIG. 4) includes a resistance element 358 connected between the operating voltage output terminal 351 and a voltage dividing terminal 357, and a variable resistance element 359 connected in series between the voltage dividing terminal 357 and the power supply voltage supply terminal $V_{SS}$. The resistance value of the variable resistance element 359 may be adjusted according to an operating voltage control signal $V_{CTRL}$. Therefore, the magnitude of the voltage $V_{OUT}'$ output from the voltage dividing terminal 357 may be adjusted according to the operating voltage control signal $V_{CTRL}$.

As shown in FIG. 6, the variable resistance element 359 includes a plurality of current paths 360 connected in parallel between the voltage dividing terminal 357 and the power supply voltage supply terminal $V_{SS}$. Each of the plurality of current paths 360 includes a resistance element 361 and a transistor 362 connected in series. The resistance value of the resistance element 361 provided in each current path 360 may be different from each other. A different bit of the operating voltage control signal $V_{CTRL}$ is input to the gate electrode of the transistor 362 provided in each current path 360. The variable resistance element 359 may have a current path 363 that does not include the transistor 362.

The comparator 35c (FIG. 4) outputs a feedback signal FB. The feedback signal FB is in the "L" state, for example, when the voltage $V_{OUT}'$ at the voltage dividing terminal 357 is larger than the reference voltage $V_{REF}$. The feedback signal FB is in the "H" state, for example, when the voltage $V_{OUT}'$ is smaller than the reference voltage $V_{REF}$.

Configuration Example

Figure 7:
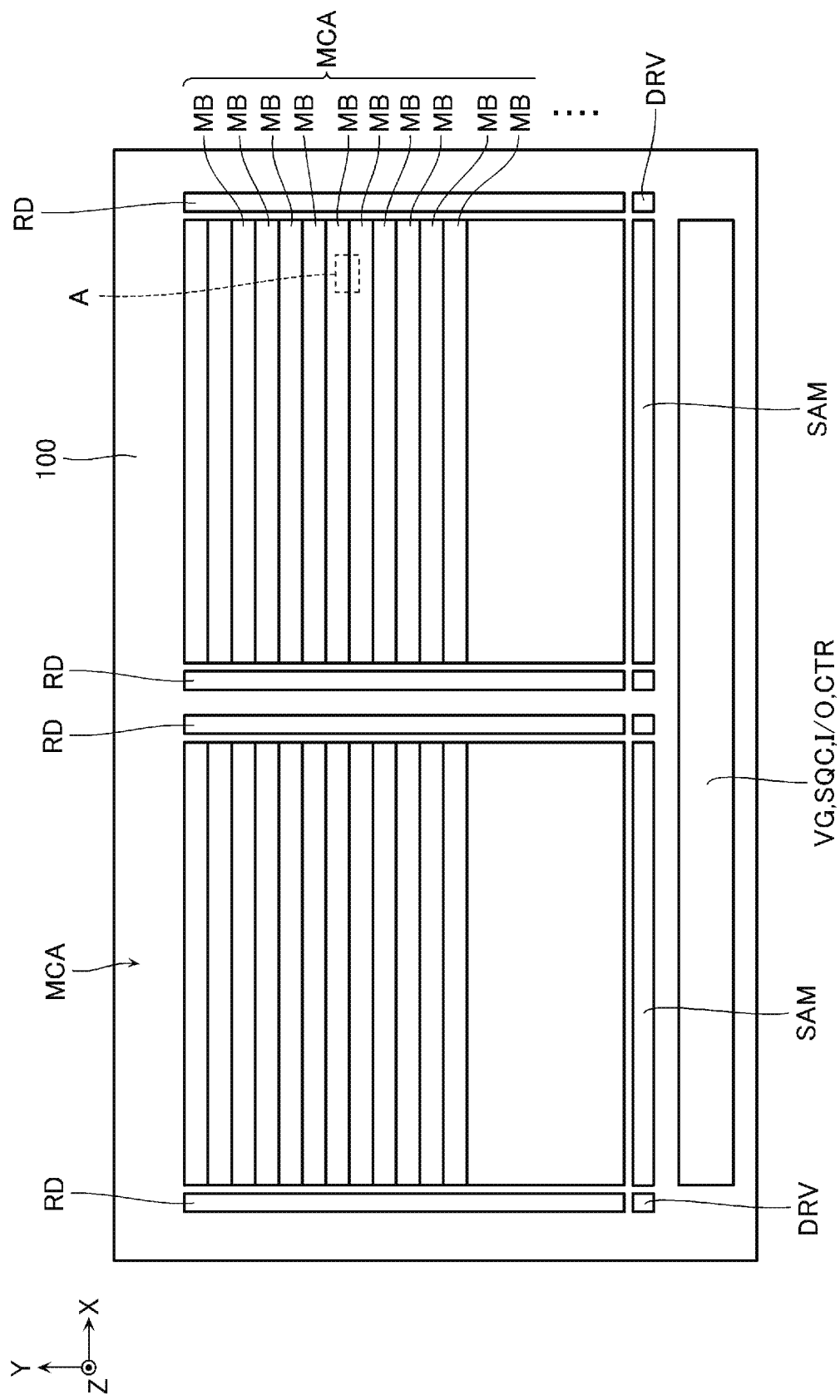
FIG. 7 is a schematic plan view showing a configuration of the memory die MD.
Figure 8:
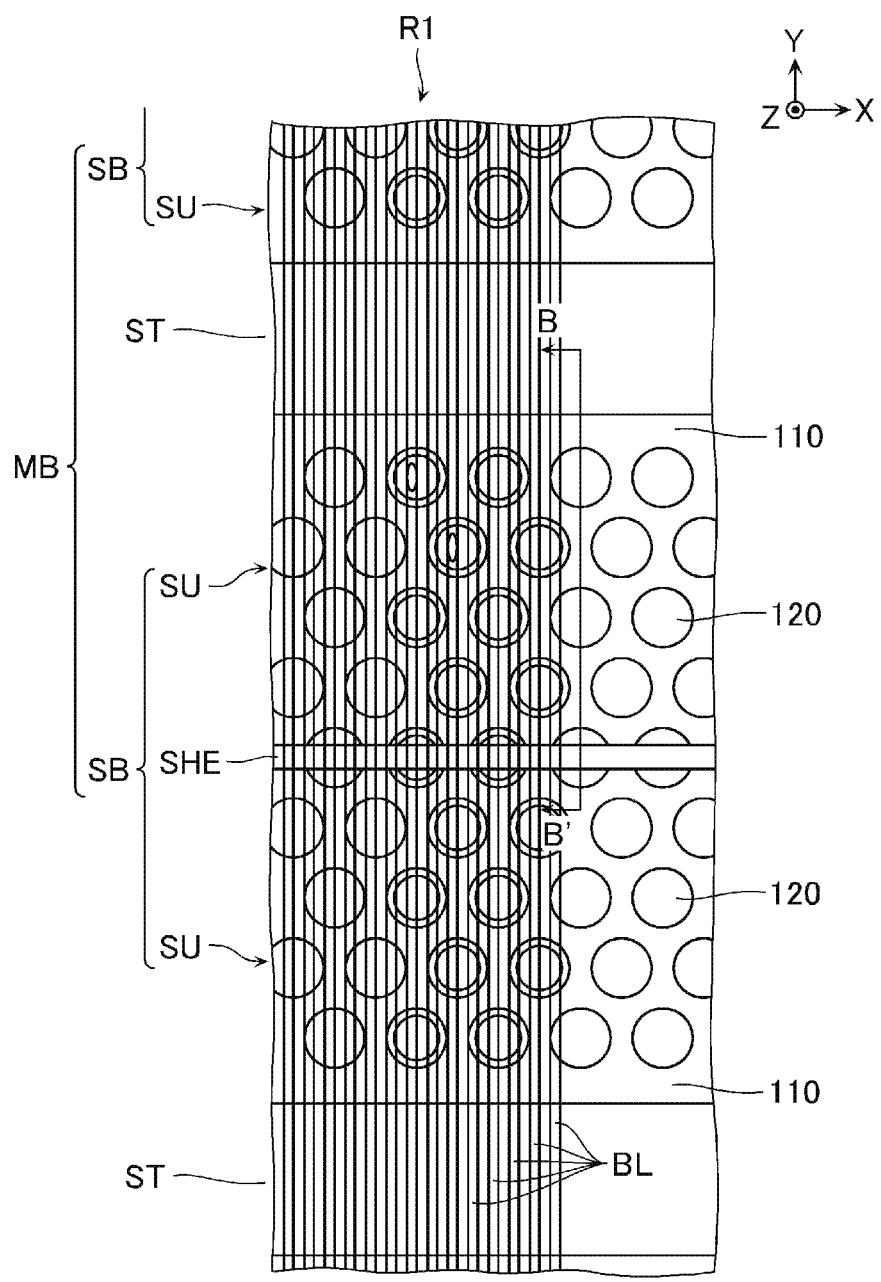
FIG. 8 is a schematic plan view showing a configuration of the memory cell array MCA.
Figure 9:
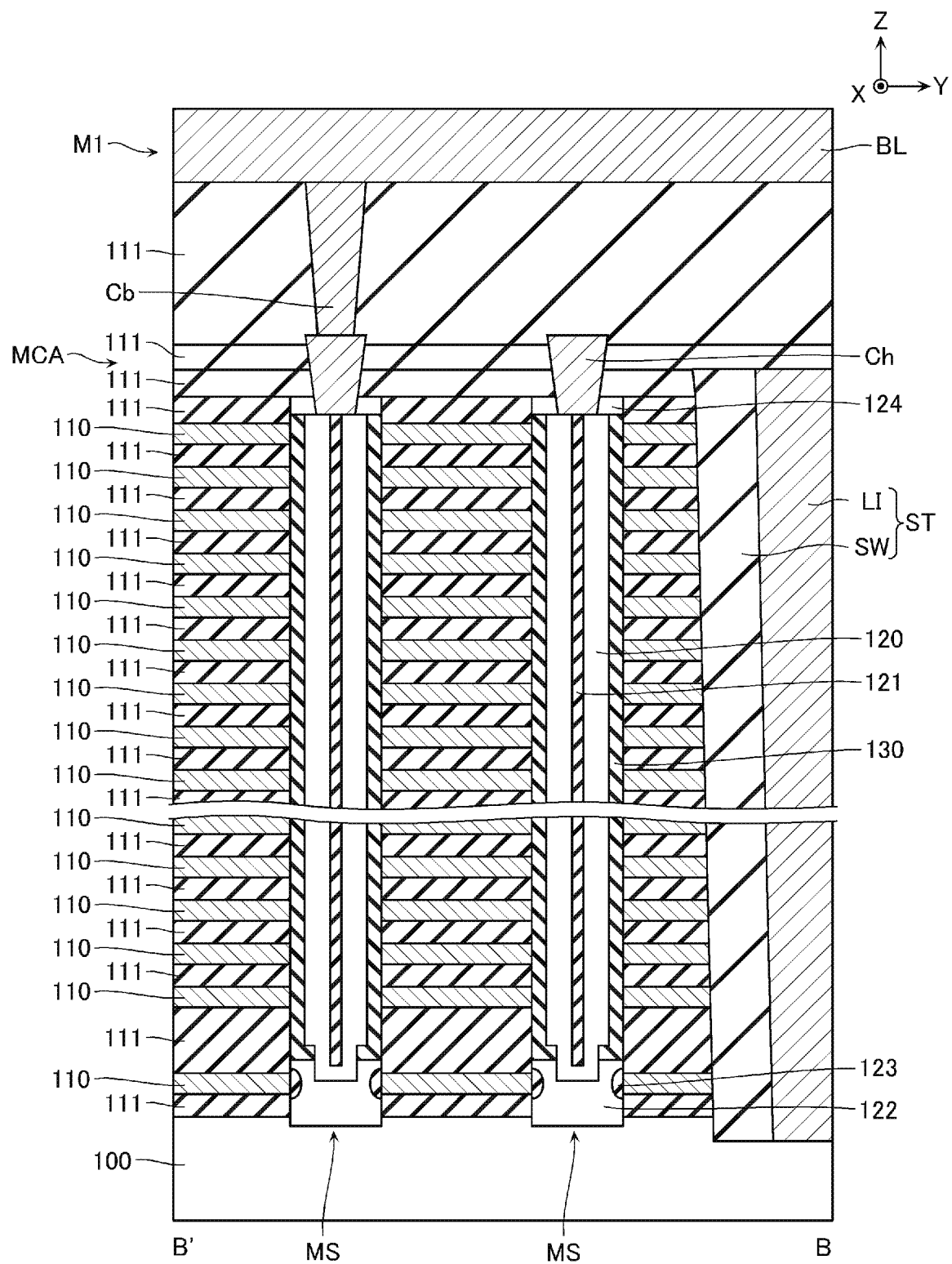
FIG. 9 is a schematic cross-sectional view showing the configuration of the memory cell array MCA.
Figure 10:
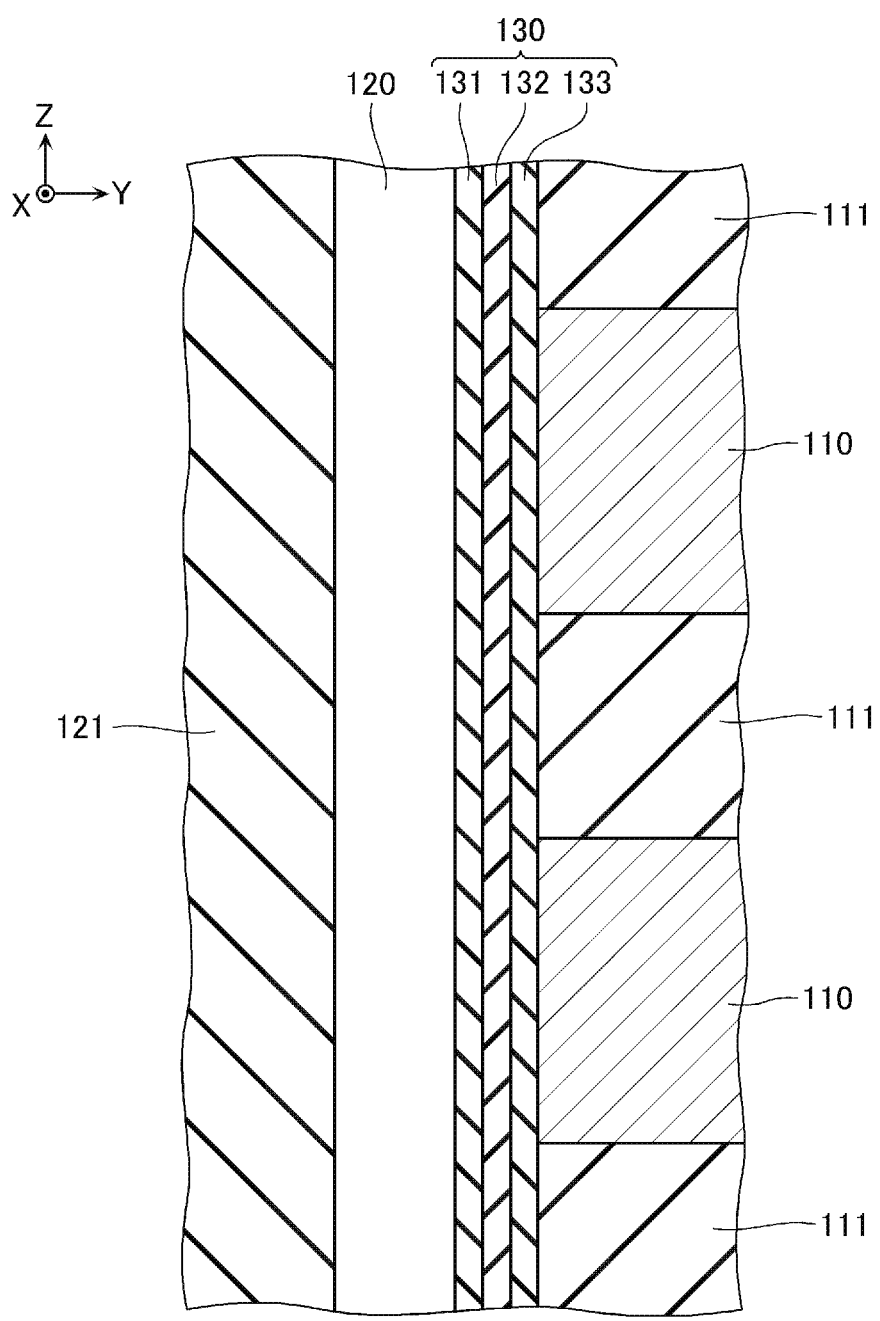
FIG. 10 is a schematic cross-sectional view showing a configuration of the memory cell MC.

Next, a configuration example of the semiconductor memory device according to the present embodiment will be described with reference to FIGS. 7 to 10. FIG. 7 is a schematic plan view of the semiconductor memory device according to the present embodiment. FIG. 8 is a schematic enlarged view of a portion indicated by A in FIG. 7. FIG. 9 is a schematic cross-sectional view of the structure shown in FIG. 8 taken along line B-B' and viewed in the direction of the arrow. FIG. 10 is a schematic enlarged view of FIG. 9. FIGS. 7 to 10 show schematic configurations, and the specific configurations may be changed as appropriate. In FIGS. 7 to 10, a part of the configuration is omitted.

As shown in FIG. 7, the semiconductor memory device according to the embodiment includes a semiconductor substrate 100. In the illustrated example, the semiconductor substrate 100 is provided with two memory cell arrays MCA arranged in the X direction. A row decoder RD is provided in a region extending in the Y direction along both ends in the X direction of the memory cell array MCA. A sense amplifier module SAM is provided in a region extending in the X direction along the end of the memory cell array MCA in the Y direction. A driver DRV is provided in a region in the vicinity of both ends in the X direction of the region in which the sense amplifier module SAM is provided. A voltage generation circuit VG, a sequencer SQC, an input and output control circuit I/O, and a logic circuit CTR are provided outside these regions.

The memory cell array MCA includes a plurality of memory blocks MB arranged in the Y direction. In the present embodiment, multi-value data such as 4 values (2 bits), 8 values (3 bits), 16 values (4 bits), and the like are recorded in the memory cells MC in the plurality of memory blocks MB. However, binary data is recorded in memory cells MC in some memory blocks MB. Such a memory cell MC is used, for example, as a buffer memory for temporarily recording user data or the like, which is recorded as multi-value data, as binary data, or as a ROM area or the like for recording a parameter or the like used for internal or external operation of the memory die MD.

As shown in FIG. 8, the memory block MB includes two sub-block structures SB arranged in the Y direction. An inter-block structure ST extending in the X direction is provided between two sub-block structures SB adjacent in the Y direction. The word lines WL in the two memory blocks MB are electrically insulated via the inter-block structure ST.

The sub-block structure SB includes two string units SU arranged in the Y direction and an inter-sub-block insulating layer SHE provided between the two string units SU.

As illustrated in FIG. 9, the string unit SU includes a plurality of conductive layers 110 provided above the semiconductor substrate 100, a plurality of semiconductor layers 120, and a plurality of gate insulating films 130 respectively provided between the plurality of conductive layers 110 and the plurality of semiconductor layers 120.

The semiconductor substrate 100 is, for example, a semiconductor substrate such as single crystal silicon (Si) containing a P-type impurity. An N-type well containing an N-type impurity such as phosphorus (P) or the like is provided on a part of the surface of the semiconductor substrate 100. A P-type well containing a P-type impurity such as boron (B) or the like is provided on a part of the surface of the N-type well.

The conductive layer 110 is a substantially plate-like conductive layer extending in the X direction, and a plurality of the conductive layers 110 are arranged in the Z direction. The conductive layer 110 may include, for example, a stacked film of titanium nitride (TiN) and tungsten (W), or may include polycrystalline silicon containing impurities such as phosphorus or boron. An insulating layer 111 such as silicon oxide ($SiO_2$) is provided between the conductive layers 110.

Among the plurality of conductive layers 110, one or a plurality of conductive layers 110 located in the lowest layer function as the source selection line SGS (FIG. 3) and gate electrodes of the plurality of source select transistors STS connected thereto. The plurality of conductive layers 110 located above this layer function as word lines WL (FIG. 3) and gate electrodes of the plurality of memory cells MC (FIG. 3) connected thereto. The one or more conductive layers 110 located above this layer function as the drain selection line SGD and gate electrodes of the plurality of drain select transistors STD (FIG. 3) connected thereto.

As shown in FIG. 8, a plurality of semiconductor layers 120 are arranged in the X direction and the Y direction. The semiconductor layer 120 is a semiconductor film such as non-doped polycrystalline silicon (Si). For example, as shown in FIG. 9, the semiconductor layer 120 has a substantially cylindrical shape, and an insulating film 121 such as silicon oxide is provided at the center portion thereof. The outer peripheral surface of the semiconductor layer 120 is surrounded by the conductive layer 110. A lower end portion of the semiconductor layer 120 is connected to the P-type well of the semiconductor substrate 100 through a semiconductor layer 122 such as non-doped single crystal silicon. The semiconductor layer 122 faces the conductive layer 110 across an insulating layer 123 such as silicon oxide. The upper end portion of the semiconductor layer 120 is connected to the bit line BL via the semiconductor layer 124 containing an N-type impurity such as phosphorus (P), and contacts Ch and Cb. Each of the semiconductor layers 120 functions as a channel region of the plurality of memory cells MC and drain select transistors STD in one memory string MS (FIG. 3). The semiconductor layer 122 functions as a partial channel region of the source select transistor STS.

For example, as shown in FIG. 10, the gate insulating film 130 includes a tunnel insulating film 131, a charge storage film 132, and a block insulating film 133 stacked between the semiconductor layer 120 and the conductive layer 110. The tunnel insulating film 131 and the block insulating film 133 are insulating films such as silicon oxide, for example. The charge storage film 132 is a film capable of storing charges, such as silicon nitride (SiN), for example. The tunnel insulating film 131, the charge storage film 132, and the block insulating film 133 have a substantially cylindrical shape, and extend in the Z direction along the outer peripheral surface of the semiconductor layer 120.

FIG. 10 shows an example in which the gate insulating film 130 includes the charge storage film 132 such as silicon nitride, but the gate insulating film 130 may include a floating gate such as polycrystalline silicon containing N-type or P-type impurities, for example.

For example, as shown in FIG. 9, the inter-block structure ST includes a conductive layer LI extending in the direction and an insulating layer SW provided between the conductive layer LI and the plurality of conductive layers 110.

The conductive layer LI is a substantially plate-like conductive layer extending in the Z direction and the X direction, and functions as a part of the source line SL. The conductive layer LI may include, for example, a stacked film of titanium nitride (TiN) and tungsten (W), or may include polycrystalline silicon containing impurities such as phosphorus or boron, or may include silicide and the like. The insulating layer SW is, for example, an insulating layer such as silicon oxide ($SiO_2$).

[Threshold Voltage of Memory Cell MC]

Next, the threshold voltage of the memory cell MC will be described with reference to FIGS. 11A to 11D. FIG. 11A is a schematic histogram for illustrating the threshold voltage of the memory cell MC in which multi-value data is recorded. The horizontal axis represents the voltage of the word line WL, and the vertical axis represents the number of memory cells MC. FIG. 11B is an example of the threshold voltage of the memory cell MC in which multi-value data is recorded and the data recorded in the memory cell MC. FIG. 11C is another example of the threshold voltage of the memory cell MC in which multi-value data is recorded and the data recorded in the memory cell MC. FIG. 11D is a schematic histogram for illustrating the threshold voltage of the memory cell MC in which binary data is recorded.

As described above, the memory cell array MCA includes a plurality of memory cells MC. When a write sequence is performed on the plurality of memory cells MC, the threshold voltages of the memory cells MC are controlled to a plurality of states.

FIG. 11A shows distributions of the threshold voltages of the memory cells MC controlled in eight states. For example, the threshold voltage of the memory cell MC controlled to the A state is larger than a read voltage $V_{CGAR}$ and a verification voltage $V_{VFYA}$, and smaller than a read voltage $V_{CGBR}$ and a verification voltage $V_{VFYB}$ in FIG. 11A. The threshold voltages of all the memory cells MC are smaller than a read pass voltage $V_{READ}$ in FIG. 11A.

In the example of FIG. 11A, 3-bit data is recorded in each memory cell MC by adjusting the memory cell MC to eight states.

For example, the Er state corresponds to the lowest threshold voltage (the threshold voltage of the memory cell MC in the erased state). For example, data "111" is allocated to the memory cell MC corresponding to the Er state.

The A state corresponds to a threshold voltage higher than the threshold voltage corresponding to the Er state. For example, data "101" is allocated to the memory cell MC corresponding to the A state.

The B state corresponds to a threshold voltage higher than the threshold voltage corresponding to the A state. For example, data "001" is allocated to the memory cell MC corresponding to the B state.

Similarly, the C state to G state in the drawing correspond to threshold voltages higher than the threshold voltages corresponding to the B state to F state, respectively. For example, data "011", "010", "110", "100", "000" are allocated to the memory cells MC corresponding to these distributions.

In the case of the allocation as illustrated in FIG. 11B, the lower bit data may be determined by one read voltage $V_{CGDR}$, and the middle bit data may be determined by three read voltages $V_{CGBR}$, $V_{CGCR}$ and $V_{CGFR}$. The upper bit data may be determined by the three read voltages $V_{CGBR}$, $V_{CGBR}$, and $V_{CGGR}$. Such data allocation may be referred to as a 1-3-3 code.

The number of bits of data to be recorded in the memory cell MC, the number of states, the allocation of data to each state, and the like may be changed as appropriate.

For example, in the case of the allocation illustrated in FIG. 11C, the lower bit data may be determined by one read voltage $V_{CGDR}$, and the middle bit data may be determined by two read voltages $V_{CGBR}$ and $V_{CGFR}$. The upper bit data may be determined by four read voltages $V_{CGBR}$, $V_{CGCR}$ $V_{CGBR}$, and $V_{CGGR}$. Such data allocation may be referred to as a 1-2-4 code.

FIG. 11D shows distributions of the threshold voltages of the memory cells MC controlled in two states. For example, the threshold voltage of the memory cell MC controlled to the upper state is larger than the read voltage $V_{CGSR}$ and a verification voltage $V_{VFYS}$ in FIG. 11D, and smaller than the read pass voltage $V_{READ}$'.

In the example of FIG. 11D, 1-bit data is recorded in each memory cell MC by adjusting the memory cell MC to two states.

For example, the lower state corresponds to a low threshold voltage (the threshold voltage of the memory cell MC in the erased state) For example, data "1" is allocated to the memory cell MC corresponding to the lower state.

The upper state corresponds to a high threshold voltage (the threshold voltage of the memory cell MC in the written state). For example, data "0" is allocated to the memory cell MC corresponding to the upper state.

[Read Operation]

Figure 12:
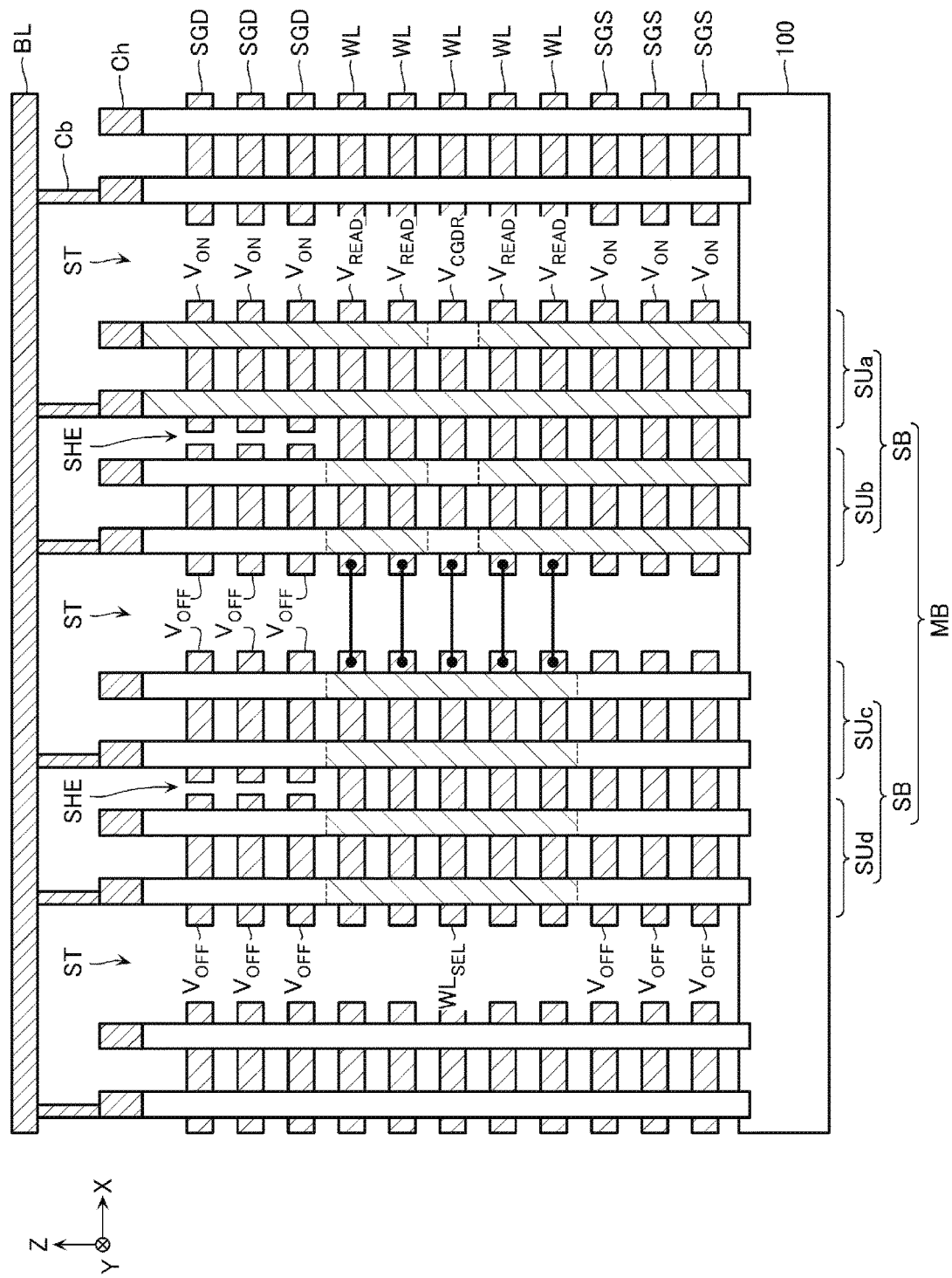
FIG. 12 is a schematic cross-sectional view for illustrating a read operation.

Next, with reference to FIGS. 11A to 12, the read operation of the semiconductor memory device according to the present embodiment will be described. FIG. 12 is a schematic cross-sectional view for illustrating the read operation. In the following description, an example will be described in which data is allocated to the memory cell MC in which multi-value data is recorded according to the 1-3-3 code of FIG. 11B.

When reading lower bits from a memory cell MC in which multi-value data is recorded, for example, as shown in FIG. 12, a plurality of selected memory cells MC in the selected page P are selectively conducted with the bit line BL and the source line SL. For example, an ON voltage $V_{ON}$ is supplied to the drain selection line SGD and the source selection line SGS corresponding to the selected page P to turn on the select transistor (STD, STS). An OFF voltage $V_{OFF}$ is supplied to the other drain selection lines SGD and source selection lines SGS to turn off the select transistor (STD, STS). The read pass voltage $V_{READ}$ is supplied to the non-selected word lines WL corresponding to the non-selected page to turn on all the memory cells MC connected to the non-selected word line WL.

As shown in FIG. 12, the read voltage $V_{CGDR}$ is supplied to the selected word line WL corresponding to the selected page P. As a result, the memory cells MC corresponding to the Er state to C state in FIG. 11A are turned on, and the memory cells MC corresponding to the D state to G state are turned off.

The sense amplifier module SAM (FIG. 2) detects the ON or OFF state of the selected memory cell MC.

Thereafter, the data detected by the sense amplifier module SAM is output. For example, data detected by the sense amplifier module SAM is transferred to the control die CD via the latch circuit XDL, the bus DB, and the input and output control circuit I/O. The control die CD performs bit error detection and correction on the data and then transfers the data to the host computer 20.

When reading the middle bits for the memory cell MC in which multi-value data is recorded, for example, the selected memory cell MC is selectively conducted with the bit line BL and the source line SL. Next, for example, the read voltage $V_{CGAR}$ is supplied to the selected word line WL, the ON or OFF state of the selected memory cell MC is detected, and the detected data is latched. Similarly, the read voltage $V_{CGCR}$ is supplied to the selected word line WL, the ON or OFF state of the selected memory cell MC is detected, and the detected data is latched. Similarly, the read voltage $V_{CGFR}$ is supplied to the selected word line WL, the ON or OFF state of the selected memory cell MC is detected, and the detected data is latched. Next, arithmetic processing such as exclusive OR is performed between the latched data, and the middle bit data of the selected memory cell MC is calculated. Thereafter, the calculated data is output.

When reading the upper bits from the memory cell MC in which multi-value data is recorded, for example, the selected memory cell MC is selectively conducted with the bit line BL and the source line SL. Next, for example, the read voltage $V_{CGBR}$ is supplied to the selected word line WL, the ON or OFF state of the selected memory cell MC is detected, and the detected data is latched. Similarly, the read voltage $V_{CGER}$ is supplied to the selected word line WL, the ON or OFF state of the selected memory cell MC is detected, and the detected data is latched. Similarly, the read voltage $V_{CGGR}$ is supplied to the selected word line WL, the ON or OFF state of the selected memory cell MC is detected, and the detected data is latched. Next, arithmetic processing such as exclusive OR is performed between the latched data to calculate the upper bit data of the selected memory cell MC. Then, the calculated data is output.

When reading from the memory cell MC (Single Level cell) in which binary data is recorded, for example, the selected memory cell MC is selectively conducted with the bit line BL and the source line SL. Next, for example, the read voltage $V_{CGSR}$ is supplied to the selected word line WL, the ON or OFF state of the selected memory cell MC is detected, and the detected data is output.

[Write Sequence]

Figure 13:
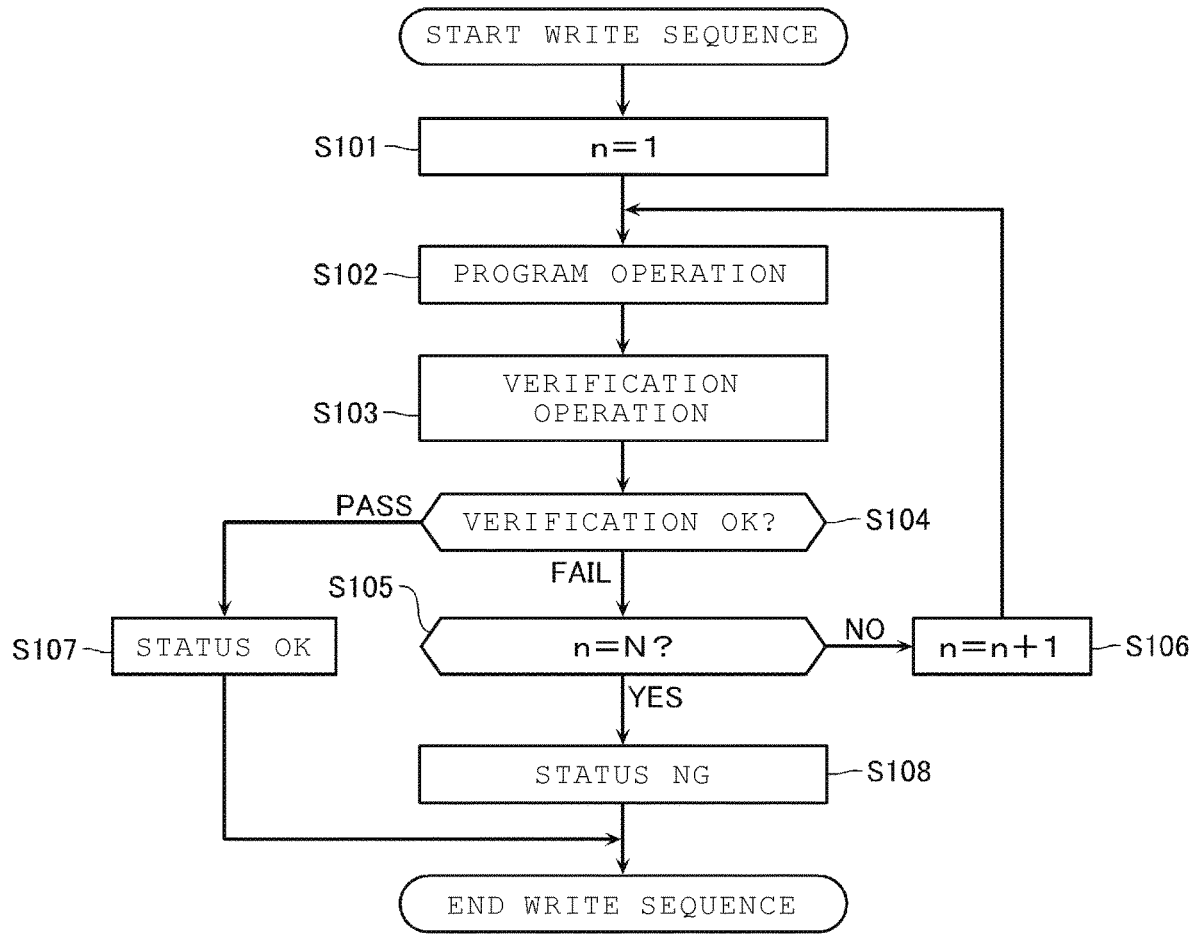
FIG. 13 is a schematic flowchart for illustrating a write sequence.
Figure 14:
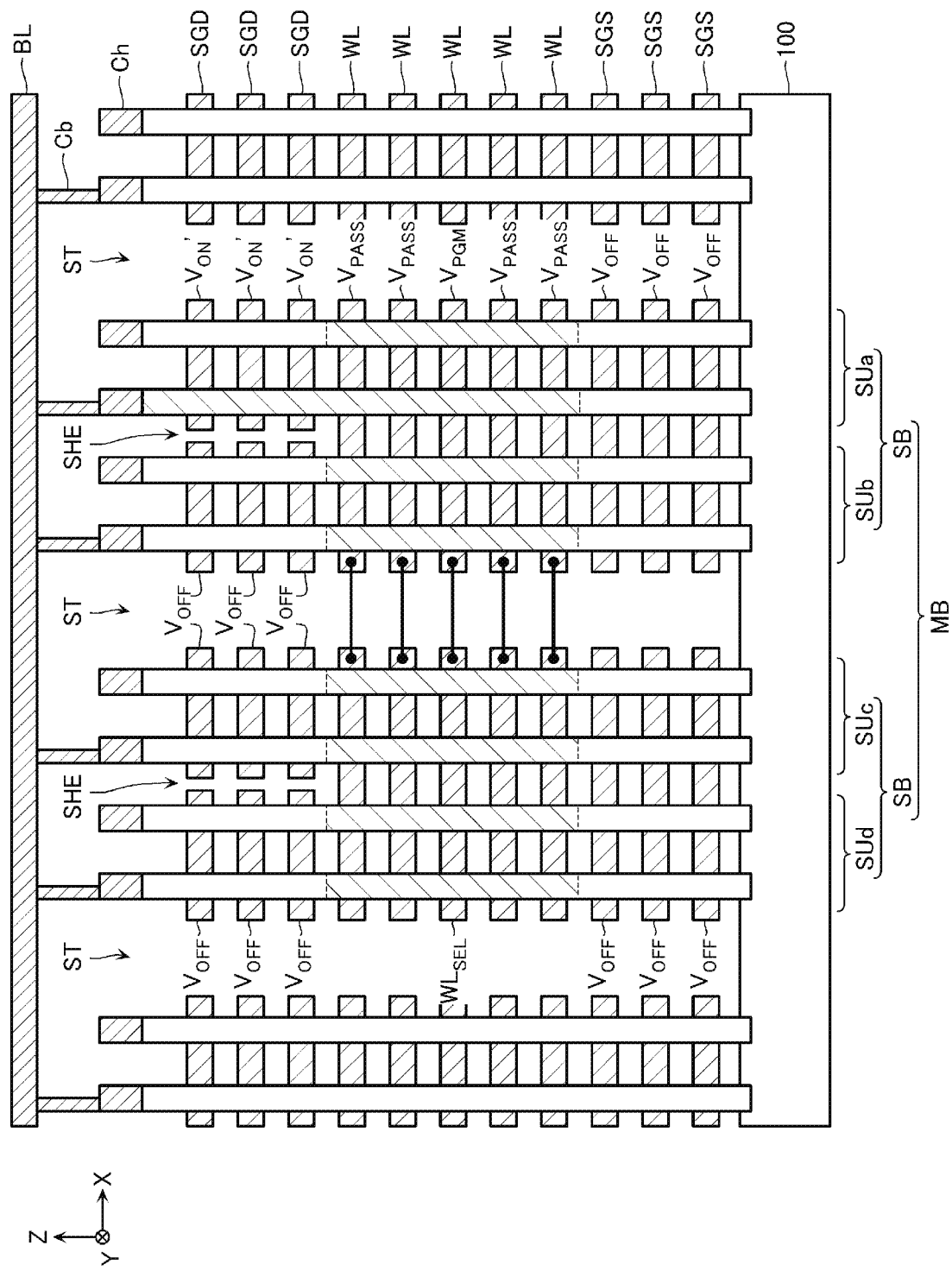
FIG. 14 is a schematic cross-sectional view for illustrating a program operation.
Figure 15:
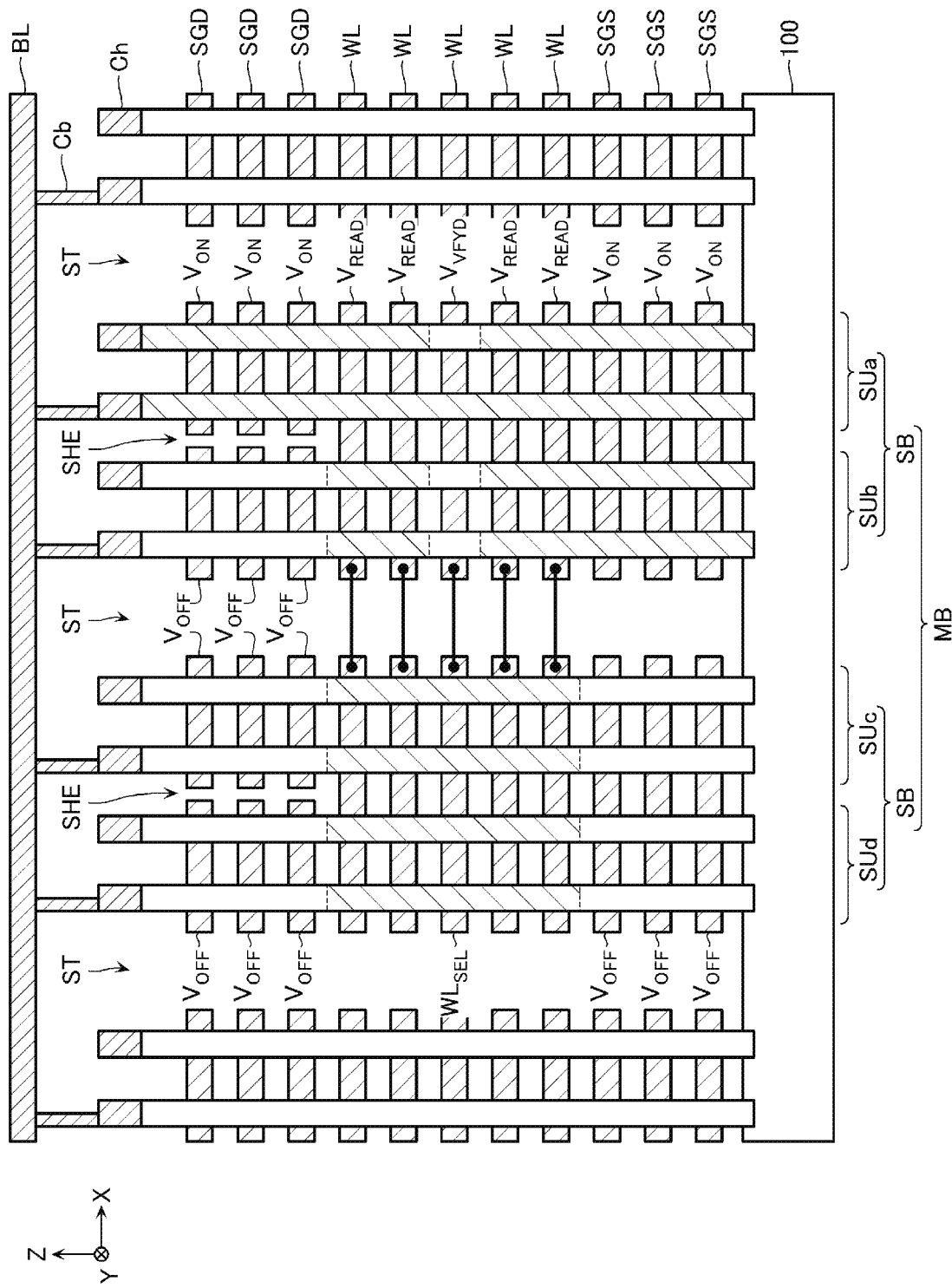
FIG. 15 is a schematic cross-sectional view for illustrating a verification operation.
Figure 16A:
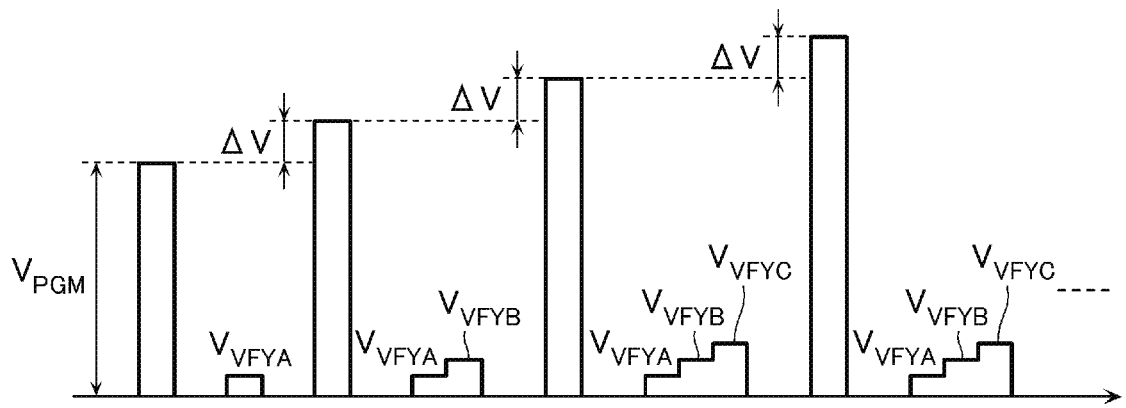
FIGS. 16A and 16B are schematic graphs showing a voltage supplied to a selected word line WL during a write sequence.
Figure 16B:
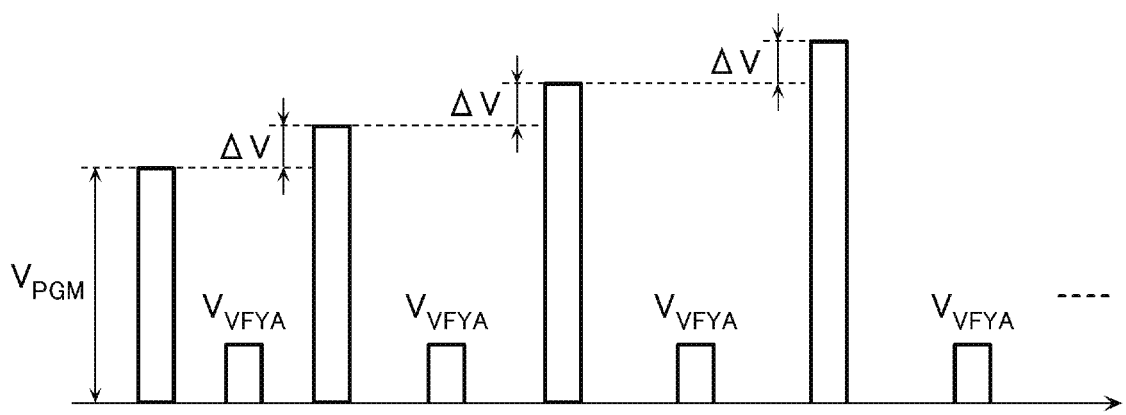

Next, a write sequence of the semiconductor memory device will be described with reference to FIGS. 13 to 16B. The write sequence includes a program operation and a verification operation. FIG. 13 is a schematic flowchart for illustrating the write sequence. FIG. 14 is a schematic cross-sectional view for illustrating the program operation. FIG. 15 is a schematic cross-sectional view for illustrating the verification operation. FIGS. 16A and 16B are schematic graphs showing the voltage supplied to the selected word line WL during the write sequence.

In step S101, the loop count n is set to 1. The loop count n is recorded in a register or the like.

In step S102, a program operation is performed.

In the program operation, for example, the bit line BL connected to the memory cell MC that adjusts the threshold voltage is supplied with a different voltage from the bit line BL connected to the memory cell MC that does not adjust the threshold voltage.

As shown in FIG. 14, the memory cell MC for adjusting the threshold voltage is selectively conducted with the bit line BL. For example, the ON voltage $V_{ON}'$ is supplied to the drain selection line SGD corresponding to the selected page P, and the OFF voltage $V_{OFF}$ is supplied to the other drain selection lines SGD. For example, the ON voltage $V_{ON}'$ may be smaller than the ON voltage $V_{ON}$ in FIG. 12. As a result, the drain select transistor STD corresponding to the bit line BL supplied with the ground voltage is turned on, and the drain select transistor STD corresponding to the bit line BL supplied with a program inhibit voltage is turned off. A write pass voltage $V_{PASS}$ is supplied to the non-selected word line WL corresponding to the non-selected page. For example, the write pass voltage $V_{PASS}$ is higher than the read pass voltage $V_{READ}$ in FIG. 12.

As shown in FIG. 14, a program voltage $V_{PGM}$ is supplied to the selected word line WL. The program voltage $V_{PGM}$ is higher than write pass voltage $V_{PASS}$. As a result, electrons are accumulated in the charge storage film 132 (FIG. 10) of the desired memory cell MC, and the threshold voltage of the memory cell MC increases.

In step S103 (FIG. 13), a verification operation is performed. In the verification operation, for example, as shown in FIG. 15, similarly to the read operation, the selected memory cell MC is selectively conducted to the bit line BL and the source line SL. Next, for example, the verification voltage $V_{VFYA}$, $V_{VFYB}$, $V_{VFYC}$, $V_{VFYD}$, $V_{VFYE}$, $V_{VFYF}$ or $V_{VFYG}$ (FIG. 11A) is supplied to the selected word line WL, and the ON or OFF state of the selected memory cell MC is detected. The data in a latch circuit SDL is transferred to the latch circuit XDL.

For example, as shown in FIG. 16A, in one verification operation for the memory cell MC in which multi-value data is recorded, a plurality of verification voltages having different magnitudes may be sequentially supplied to the selected word line WL. For example, when the selected page P includes a plurality of memory cells MC corresponding to the A state to the C state, the following operation may be executed in one verification operation. For example, the selected memory cell MC is selectively conducted with the bit line BL and the source line SL. Next, the verification voltage $V_{VFYA}$ is supplied to the selected word line WL, and the ON or OFF state of the selected memory cell MC corresponding to the A state is detected and latched. Next, the verification voltage $V_{VFYB}$ is supplied to the selected word line WL, and the ON or OFF state of the selected memory cell MC corresponding to the B state is detected and latched. Next, the verification voltage $V_{VFYC}$ is supplied to the selected word line WL, and the ON or OFF state of the selected memory cell MC corresponding to the C state is detected and latched. Thereafter, the latched data is transferred to the latch circuit XDL.

On the other hand, as shown in FIG. 16B, for example, only one verification voltage is supplied to the selected word line WL in one verification operation for the memory cell MC in which binary data is recorded. For example, the selected memory cell MC is selectively conducted with the bit line BL and the source line SL. Next, the verification voltage $V_{VFYS}$ is supplied to the selected word line WL, the ON or OFF state of the selected memory cell MC corresponding to the upper state is detected, and the detected data is transferred to the latch circuit XDL.

In step S104 (FIG. 13), the result of the verification operation is determined. For example, if the data stored in the latch circuit XDL contains "L" above a certain level, it is determined as verification FAIL, and the process proceeds to step S105. On the other hand, if the data stored in the latch circuit XDL does not include "L" above a certain level, it is determined as verification PASS, and the process proceeds to step S107.

In step S105, it is determined whether the loop count n has reached a predetermined number N. If not, the process proceeds to step S106. If so, the process proceeds to step S108.

In step S106, 1 is added to the loop count n, and the process proceeds to step S102. In step S106, for example, as shown in FIGS. 16A and 16B, a predetermined voltage ΔV is added to the program voltage $V_{PGM}$.

In step S107, status data indicating that the write sequence ended normally is stored in the status register STR (FIG. 2), and is output to the control die CD (FIG. 1), thereby completing the write sequence.

In step S108, status data indicating that the write sequence did not end normally is stored in the status register STR (FIG. 2), and is output to the control die CD (FIG. 1), thereby completing the write sequence.

[Change in Characteristics of Memory Cell MC]

Figure 17:
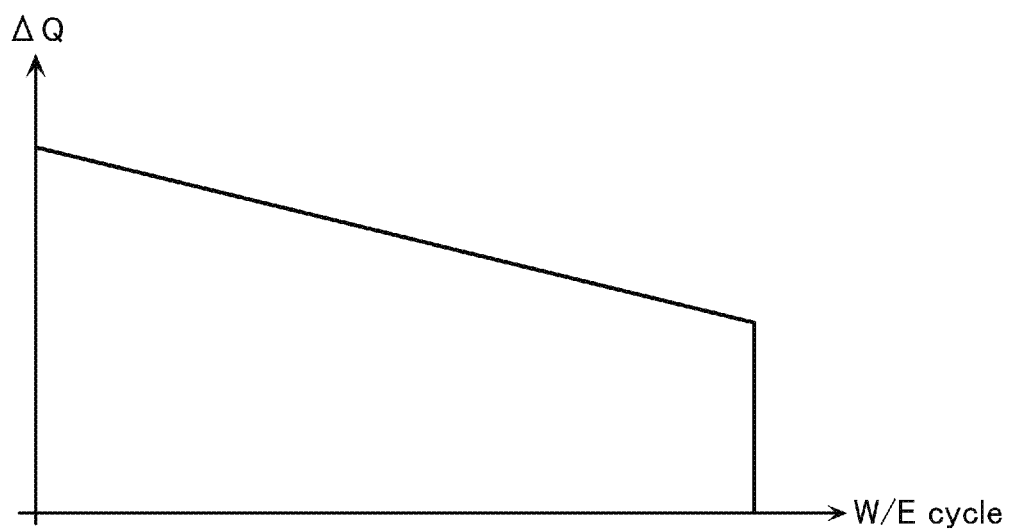
FIG. 17 is a schematic graph for illustrating a change in characteristics of the memory cell MC.

FIG. 17 is a schematic graph for illustrating a change in characteristics of the memory cell MC. The horizontal axis represents the number of times of execution of the write sequence and the erase sequence (hereinafter sometimes referred to as "write and erase number"). The vertical axis represents the charge amount of electrons accumulated in the charge storage film 132 (FIG. 10) of the memory cell MC during one write sequence (the charge amount of electrons passing through the tunnel insulating film 131 (FIG. 10)).

As described above, when a program operation is performed on the memory cell MC, electrons are accumulated in the charge storage film 132 of the memory cell MC, and the threshold voltage of the memory cell MC increases. When the erase sequence is executed on the memory cell MC, electrons are extracted from the charge storage film 132 of the memory cell MC, and the threshold voltage of the memory cell MC decreases.

However, in the program operation, some electrons may be trapped in the tunnel insulating film 131, the charge storage film 132, or a deep trap level in the interface therebetween. Such electrons may not be extracted even when the erase sequence is executed. Accordingly, when the write sequence and the erase sequence are repeatedly performed on the memory cell MC, such electrons may be accumulated in the charge storage film 132.

In such a case, for example, when the number of writing and erasing to the memory cell MC is relatively small, in order to increase the threshold value of the memory cell MC to a desired magnitude, it may be necessary to accumulate a relatively large amount of electrons in the charge storage film 132 of the memory cell MC by supplying a program voltage for a relatively large number of times. On the other hand, for example, when the number of writing and erasing to the memory cell MC is relatively large, in order to increase the threshold value of the memory cell MC to a desired magnitude, it may be sufficient to accumulate a relatively small amount of electrons in the charge storage film 132 of the memory cell MC by supplying a program voltage for a relatively small number of times.

In such a case, for example, as shown in FIG. 17, the charge amount of electrons necessary to be accumulated in the charge storage film 132 of the memory cell MC in one write sequence decreases as the write and erase number increases.

Figure 18:
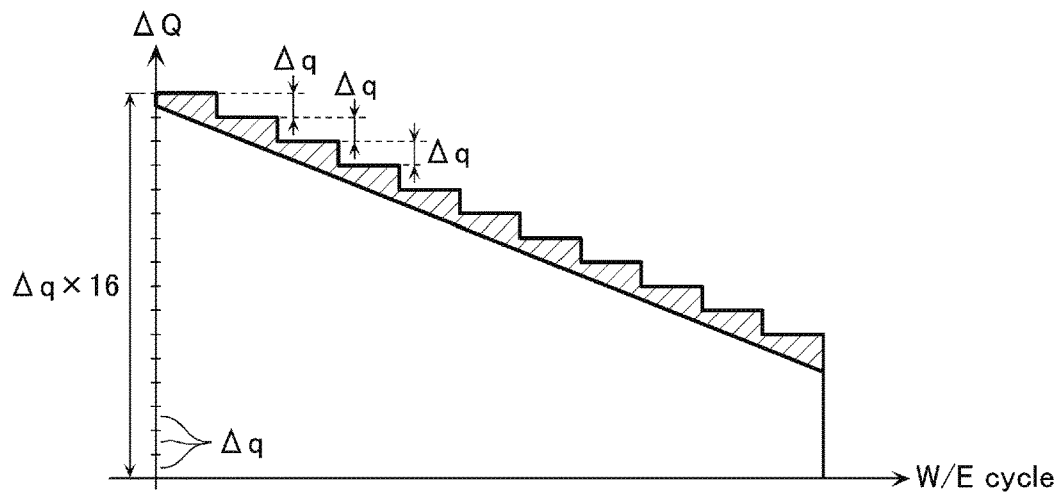
FIG. 18 is a schematic graph for illustrating the charge amount of electrons supplied to the memory cell MC during the write sequence.

Here, in order to extend the lifespan of the memory cell MC, it is desirable to minimize the amount of electrons accumulated in the charge storage film 132 of the memory cell MC in one write sequence. For this purpose, for example, it is conceivable to set the initial value and the increase amount ΔV (see FIGS. 16A and 16B) of the program voltage $V_{PGM}$ to a small magnitude. In such a case, for example, as shown in FIG. 18, when the program voltage $V_{PGM}$ is supplied once, the amount of charge Δq accumulated in the charge storage film 132 becomes small. Therefore, the number of program operations in the write sequence decreases as the write and erase number increases, and the amount of electrons accumulated in the charge storage film 132 of the memory cell MC can be made close to the necessary minimum amount.

However, in the embodiment as shown in FIG. 18, the number of program operations in one write sequence increases, and the execution time of the write sequence may increase. In the memory cell MC in which multi-value data is recorded, the threshold voltage of the memory cell MC may be finely adjusted. Therefore, the control as shown in FIG. 18 may be relatively compatible. However, in the memory cell MC in which binary data is recorded, a high-speed operation may be required, and it may be difficult to apply control as shown in FIG. 18.

Therefore, it is also possible to consider that, for example, the control as shown in FIG. 18 is performed for the memory cell MC in which multi-value data is recorded, and the initial value and the increase amount ΔV of the program voltage $V_{PGM}$ are set to a relatively large value for the memory cell MC in which binary data is recorded.

Figure 19:
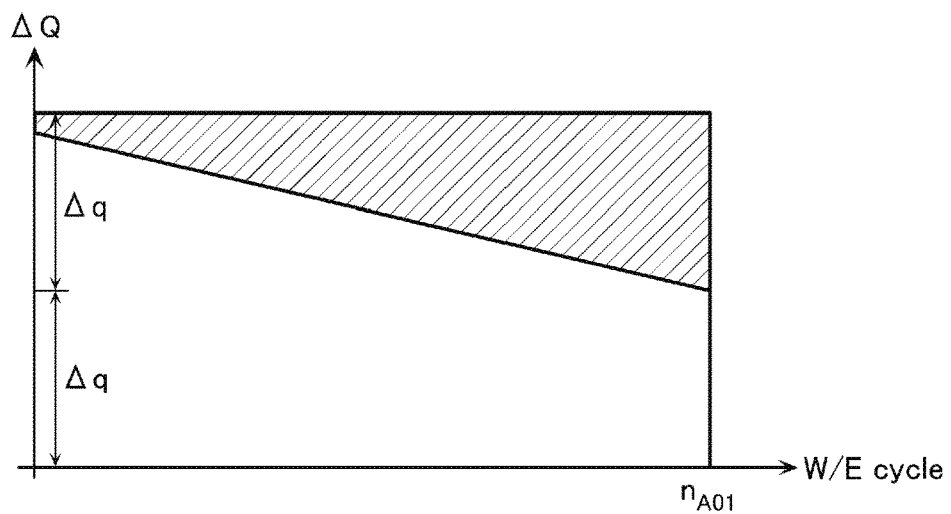
FIG. 19 is a schematic graph for illustrating the charge amount of electrons supplied to the memory cell MC during the write sequence.

However, in such a case, as shown in FIG. 19, as the write and erase number increases, the difference between the amount of electrons passing through the tunnel insulating film 131 of the memory cell MC in one write sequence and the necessary minimum amount increases, and the maximum value $n_{401}$ of the write and erase number with respect to the memory cell MC may decrease.

[Adjustment of Program Voltage $V_{PGM}$]

In the present embodiment, the write and erase number with respect to the memory cell MC is monitored, and at least one of the initial value and the increase amount ΔV of the program voltage $V_{PGM}$ is reduced as the write and erase number increases. For example, when the write and erase number with respect to the memory cell MC is 0 to $n_{411}$ ($n_{411}$ is a natural number), $n_{411}$ to $n_{412}$ ($n_{412}$ is a natural number), and $n_{412}$ to $n_{413}$ ($n_{413}$ is a natural number), at least one of the initial value and the increase amount ΔV of the program voltage $V_{PGM}$ is set to a different magnitude.

Figure 20:
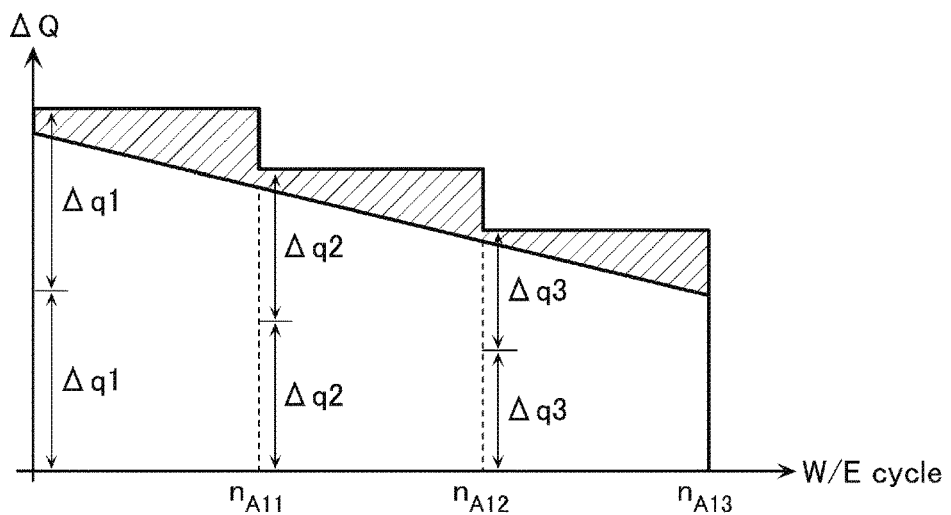
FIG. 20 is a schematic graph for illustrating the charge amount of electrons supplied to the memory cell MC during the write sequence.

According to such a method, as shown in FIG. 20, the charge amount of electrons accumulated in the charge storage film 132 in one program operation gradually decreases as $\Delta q_1$, $\Delta q_2$ ($<\Delta q_1$), and $\Delta q_3$ ($<\Delta q_2$). As a result, the amount of electrons passing through the tunnel insulating film 131 of the memory cell MC can be made close to the necessary minimum amount without increasing the number of program operations in one write sequence. As a result, it is possible to provide a semiconductor memory device having a long lifespan and high speed.

Such a method is applicable to both the memory cell MC in which multi-value data is recorded and the memory cell MC in which binary data is recorded. However, as described above, a high-speed operation may be required in the memory cell MC in which binary data is recorded, and a relatively large amount of electrons may be accumulated in the charge storage film 132 of the memory cell MC in one program operation. Therefore, it is conceivable that by decreasing at least one of the initial value and the increase amount ΔV of the program voltage $V_{PGM}$ as the write and erase number increases, the amount of electrons passing through the tunnel insulating film 131 of the memory cell MC is made close to a necessary minimum amount, and the long lifespan and high-speed operation of the memory cell MC can be achieved more effectively.

Next, a more specific method for such a method will be described.

Figures 21, 22, 23:
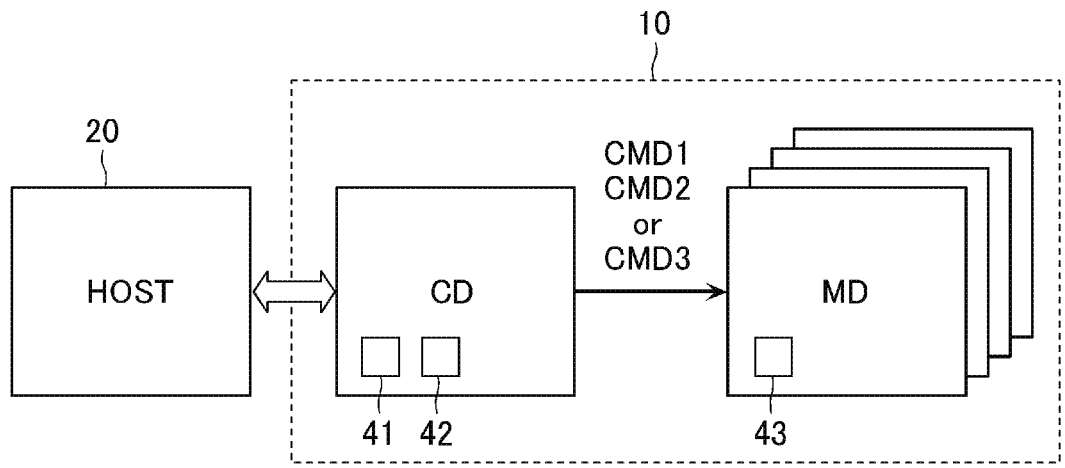
FIG. 21 is a schematic block diagram showing a configuration of a semiconductor memory device according to a first embodiment.
FIG. 22 is a schematic diagram showing a configuration example of a write and erase number storage unit 41.
FIG. 23 is a schematic diagram showing a configuration example of the write and erase number storage unit 41.

In order to perform the above method, for example, as shown in FIG. 21, it is possible to provide the control die CD with a write and erase number storage unit 41 and a command storage unit 42. In such a case, the write and erase number storage unit 41 is provided, for example, in a ROM in the control die CD. In addition, the parameter storage unit 43 may be provided in each memory die MD. In such a case, the parameter storage unit 43 may be provided, for example, in a ROM area in the memory cell array MCA (FIG. 7).

In the example shown in FIG. 21, when a command for executing a write sequence is transmitted from the control die CD to the memory die MD, the CPU in the control die CD refers to the write and erase number storage unit 41 to acquire the write and erase number. The command storage unit 42 is referred to, and a command CMD1, a command CMD2, or a command CMD3 corresponding to the acquired write and erase number is acquired. The acquired command is transmitted to the memory die MD. The memory die MD refers to the parameter storage unit 43 and acquires the initial value and the increase amount $\Delta V$ of the program voltage $V_{PGM}$ as parameters corresponding to the command CMD1, the command CMD2, or the command CMD3. The program voltage $V_{PGM}$ is calculated according to the parameters, and is input to the predetermined operating voltage generation unit 35 as the operating voltage control signal $V_{CTRL}$ (FIGS. 4 and 6).

Figures 24, 25, 26:
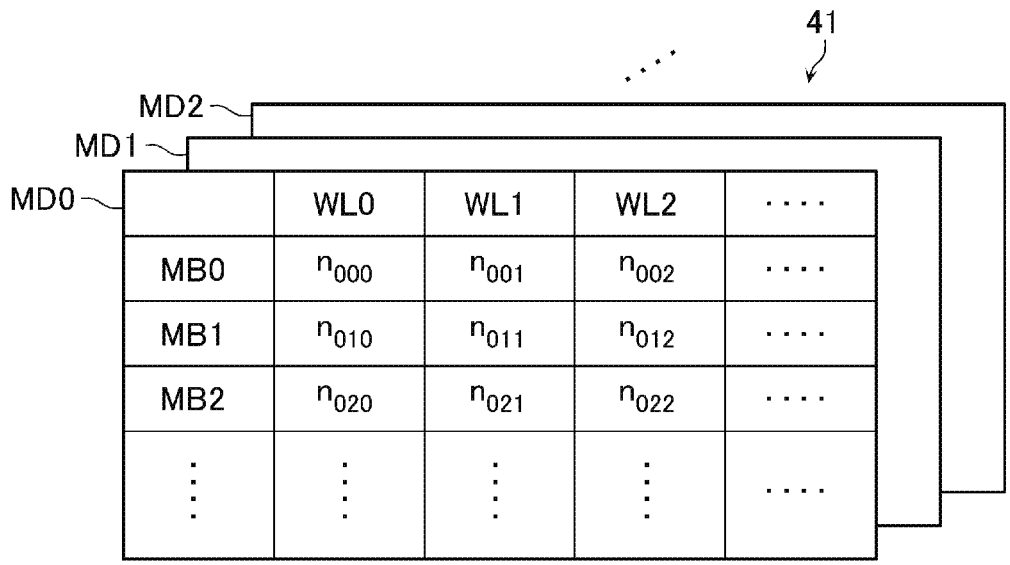
FIG. 24 is a schematic diagram showing a configuration example of the write and erase number storage unit 41.
FIG. 25 is a schematic diagram showing a configuration example of a command storage unit 42.
FIG. 26 is a schematic diagram illustrating a configuration example of a parameter storage unit 43.

For example, as shown in FIG. 22, the write and erase number storage unit 41 may store the minimum value, the maximum value, or a value therebetween (average value, or the like) $n_0, n_1, n_2, \ldots$ of the write and erase number of the memory cell MC for each of a plurality of memory dies MD (memory dies MD0, MD1, MD2, ...) controlled by the control die CD. Further, as shown in FIG. 23, for example, the write and erase number storage unit 41 may store the minimum value, the maximum value, or a value therebetween (average value, or the like) $n_{00}, n_{01}, n_{02}, \ldots$ of the write and erase number of the memory cell MC for each of a plurality of memory blocks MB (memory blocks MB0, MB1, MB2, ...) in the plurality of memory dies MD0, MD1, MD2, ... controlled by the control die CD. Here, the write and erase number storage unit 41 may be the same as the storage unit used for wear leveling. As shown in FIG. 24, for example, the write and erase number storage unit 41 may store the minimum value, the maximum value, or a value therebetween (average value, or the like) $n_{000}, n_{001}, n_{002}, \ldots$ of the write and erase number of the memory cell MC for each of a plurality of word lines (word lines WL0, WL1, WL2, ...) in the plurality of memory blocks MB (memory blocks MB0, MB1, MB2, ...) in the plurality of memory dies MD0, MD1, MD2, ... controlled by the control die CD. The write and erase number storage unit 41 may store the minimum value, the maximum value, or a value therebetween (average value, or the like) of the write and erase number of all the memory cells MC controlled by the control die CD as one value.

For example, as shown in FIG. 25, the command storage unit 42 may store commands CMD (CMD1, CMD2, and CMD3) to be transmitted to the memory die MD for each range of the write and erase number of the memory cell MC. The command storage unit 42 illustrated in FIG. 25 stores the command CMD1 corresponding to the case where the write and erase number of the memory cell MC is 0 times to $n_{A11}$ times, the command CMD2 corresponding to the case where the write and erase number of the memory cell MC is $(n_{A11}+1)$ times to $n_{A12}$ times, and the command CMD3 corresponding to the case where the write and erase number of the memory cell MC is $(n_{A12}+1)$ times to $n_{A13}$ times.

Figures 27, 28, 29:
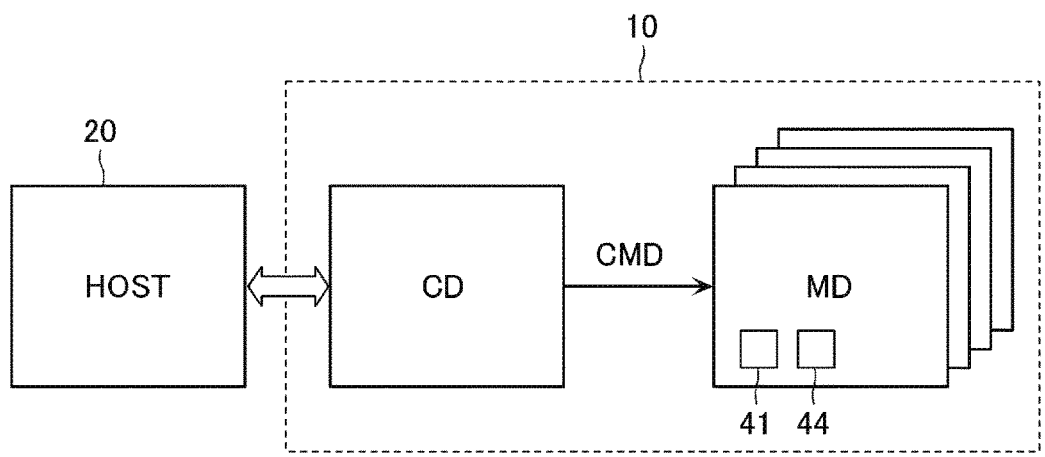
FIG. 27 is a schematic diagram illustrating a configuration example of the parameter storage unit 43.
FIG. 28 is a schematic diagram illustrating a configuration example of the parameter storage unit 43.
FIG. 29 is a schematic block diagram showing a configuration of a semiconductor memory device according to a modification.

For example, as shown in FIG. 26, the parameter storage unit 43 may store the initial values ($V_{PGM1}$, $V_{PGM2}$, and $V_{PGM3}$) of the program voltage $V_{PGM}$ for each of the commands CMD1, CMD2, and CMD3 transmitted from the control die CD. For example, as shown in FIG. 27, the parameter storage unit 43 may store the initial values ($V_{PGM1}$, $V_{PGM2}$, and $V_{PGM3}$) and the increase amounts $\Delta V$ ($\Delta V_2$, $4V_2$, and $\Delta V_3$) of the program voltage $V_{PGM}$ for each of the commands CMD1, CMD2, and CMD3 transmitted from the control die CD. Although the illustration thereof is omitted, the parameter storage unit 43 may store the increase amounts $\Delta V$ ($\Delta V_2$, $\Delta V_2$, and $\Delta V_3$) of the program voltage $V_{PGM}$ for each of the commands CMD1, CMD2, and CMD3 transmitted from the control die CD. The initial value $V_{PGM1}$ of the program voltage $V_{PGM}$ is larger than the initial value $V_{PGM2}$, and the initial value $V_{PGM2}$ is larger than the initial value $V_{PGM3}$. The increase amount $\Delta V_1$ of the program voltage $V_{PGM}$ is larger than the increase amount $\Delta V_2$, and the increase amount $\Delta V_2$ is larger than the increase amount $\Delta V_3$. However, depending on the magnitude of the initial values $V_{PGM1}$, $V_{PGM2}$, and $V_{PGM3}$ of the program voltage $V_{PGM}$, the increase amount $\Delta V_1$ may be smaller than the increase amount $\Delta V_2$, and the increase amount $\Delta V_2$ may be smaller than the increase amount $\Delta V_3$.

For example, as shown in FIG. 28, the parameter storage unit 43 may store at least one of the initial values ($V_{PGM11}$, $V_{PGM12}$, $V_{PGM13}$, $V_{PGM21}$, $V_{PGM22}$, $V_{PGM23}$, $V_{PGM31}$, $V_{PGM32}$, and $V_{PGM33}$) and the increase amounts $\Delta V$ ($\Delta V_{11}$, $\Delta V_{12}$, $\Delta V_{13}$, $\Delta V_{21}$, $\Delta V_{22}$, $\Delta V_{23}$, $\Delta V_{31}$, $\Delta V_{32}$, and $\Delta V_{33}$) of the program voltage $V_{PGM}$ for each word line WL including the commands CMD1, CMD2, and CMD3 transmitted from the control die CD, and the selected memory cell MC. The initial values $V_{PGM11}$, $V_{PGM12}$, and $V_{PGM13}$ of the program voltage $V_{PGM}$ are larger than the initial values $V_{PGM21}$, $V_{PGM22}$, and $V_{PGM23}$. The initial values $V_{PGM22}$, $V_{PGM22}$, and $V_{PGM23}$ are larger than the initial values $V_{PGM31}$, $V_{PGM32}$, and $V_{PGM33}$. The increase amounts $\Delta V_{11}$, $\Delta V_{12}$, and $\Delta V_{13}$ of the program voltage $V_{PGM}$ are larger than the increase amounts $\Delta V_{21}$, $\Delta V_{22}$, and $\Delta V_{23}$. The increase amounts $\Delta V_{21}$, $\Delta V_{22}$, and $\Delta V_{23}$ are larger than the increase amounts $\Delta V_{31}$, $\Delta V_{32}$, and $\Delta V_{33}$.

The above methods are merely examples, and specific methods and the like may be adjusted as appropriate.

For example, in the example shown in FIG. 29, the write and erase number storage unit 41 is not provided in the control die CD, and the write and erase number storage unit 41 and the parameter storage unit 44 are provided in the memory die MD. In such a case, the write and erase number storage unit 41 and the parameter storage unit 44 may be provided, for example, in a ROM area in the memory cell array MCA (FIG. 7).

In the example shown in FIG. 29, when executing the write sequence, the memory die MD refers to the write and erase number storage unit 41 to acquire the write and erase number. The parameter storage unit 44 is referred to, and the initial value and increase amount $\Delta V$ of the program voltage $V_{PGM}$ are acquired as parameters corresponding to the acquired write and erase number. The program voltage $V_{PGM}$ is calculated according to the parameters, and is input to the predetermined operating voltage generation unit 35 as the operating voltage control signal $V_{CTRL}$ (FIGS. 4 and 6).

Figures 30, 31, 32, 33:
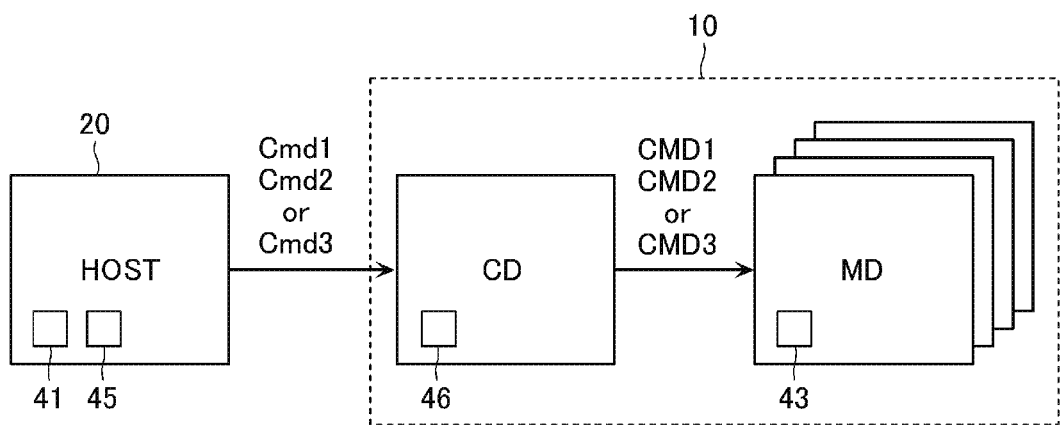
FIG. 30 is a schematic diagram illustrating a configuration example of a parameter storage unit 44.
FIG. 31 is a schematic block diagram showing a configuration of a semiconductor memory device according to a modification.
FIG. 32 is a schematic diagram showing a configuration example of a command storage unit 45.
FIG. 33 is a schematic diagram illustrating a configuration example of a command storage unit 46.

For example, as shown in FIG. 30, the parameter storage unit 44 may store at least one of the initial values ($V_{PGM1}$, $V_{PGM2}$, and $V_{PGM3}$) and the increase amounts $\Delta V$ ($\Delta V_1$, $\Delta V_2$, and $\Delta V_3$) of the program voltage $V_{PGM}$ for each range of the write and erase number of the memory cell MC. As described with reference to FIG. 28, for example, the parameter storage unit 44 may store at least one of the initial value and the increase amount $\Delta V$ of the program voltage $V_{PGM}$ for each word line WL including the range of the write and erase number of the memory cell MC and the selected memory cell MC.

For example, in the example shown in FIG. 31, the control die CD and the memory die MD are not provided with the write and erase number storage unit 41, and the host computer 20 is provided with the write and erase number storage unit 41 and the command storage unit 45. The control die CD is provided with a command storage unit 46. The parameter storage unit 43 is provided in the memory die MD.

In the example shown in FIG. 31, when transmitting a command for executing a write sequence from the host computer 20 to the control die CD, the CPU or the like in the host computer 20 refers to the write and erase number storage unit 41 to acquire the write and erase number. The command storage unit 45 is referred to, and a command Cmd1, a command Cmd2, or a command Cmd3 corresponding to the acquired write and erase number is acquired. The acquired command is transmitted to the control die CD. The CPU or the like in the control die CD refers to the write and erase number storage unit 41 to acquire the command CMD1, the command CMD2, or the command CMD3 corresponding to the command Cmd1, the command Cmd2, or the command Cmd3. The acquired command is transmitted to the memory die MD. The memory die MD refers to the parameter storage unit 43 to acquire the initial value and the increase amount $\Delta V$ of the program voltage $V_{PGM}$ as parameters corresponding to the command CMD1, the command CMD2, or the command CMD3. The program voltage $V_{PGM}$ is calculated according to the parameters, and is input to the predetermined operating voltage generation unit 35 as the operating voltage control signal $V_{CTRL}$ (FIGS. 4 and 6).

The command storage unit 45 is configured in substantially the same manner as the command storage unit 42 as illustrated in FIG. 32, for example. However, the command storage unit 42 stores the commands CMD1, CMD2, and CMD3 transmitted to the memory die MD, whereas the command storage unit 45 stores the commands Cmd1, Cmd2, and Cmd3 transmitted to the control die CD.

For example, as illustrated in FIG. 33, the command storage unit 46 stores commands Cmd1, Cmd2, and Cmd3 transmitted to the control die CD and commands CMD1, CMD2, and CMD3 transmitted to the memory die MD in association with each other.

OTHER EMBODIMENTS

The semiconductor memory device according to the embodiment has been described above. However, the above description is merely an example, and the above-described configuration, method, and the like may be adjusted as appropriate.

For example, in the above example, at least one of the initial value and the increase amount $\Delta V$ of the program voltage $V_{PGM}$ is reduced as the number of writing and erasing to the memory cell MC increases. However, in order to provide a long-lifespan and high-speed semiconductor memory device, the amount of electrons passing through the tunnel insulating film 131 of the memory cell MC may be made close to the necessary minimum amount without increasing the number of program operations in one write sequence. Therefore, it is possible to appropriately adjust how the program voltage $V_{PGM}$ is adjusted as the write and erase number increases. For example, when the maximum m (m is a natural number) times of program operations are executed in one write sequence, the average value of program voltages in the first to m-th program operations of the write sequence may be reduced as the write and erase number increases. Such a method may be performed, for example, by adjusting the program voltage $V_{PGM}$ in at least one program operation among a plurality of program operations in the write sequence.

In the above-described example, as described with reference to FIG. 2 and the like, a so-called NAND flash memory including a plurality of memory cells MC in which the memory cell arrays MCA are connected in series has been exemplified. However, the method as described above may be applied to any devices other than the NAND flash memory as long as the memory cell has a configuration corresponding to the charge storage film 132 (a charge storage film such as silicon nitride, a floating gate such as polycrystalline silicon, or another configuration capable of storing charges). For example, the present disclosure may be also applied to a NOR-type flash memory, or the like. The above-described method may be also applied to a device that does not have a configuration corresponding to the charge storage film 132 if the device has such a property that a necessary program voltage (or a corresponding write voltage or the like) decreases as the write and erase number increases.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory transistor having a gate electrode;
a first word line connected to the gate electrode of the first memory transistor;
a peripheral circuit connected to the first word line; and
a plurality of electrodes connected to the peripheral circuit and configured to receive data input and provide data output, wherein
in response to a write command via the plurality of electrodes, the peripheral circuit is configured to:
execute a first write sequence including a first program operation of applying a first program voltage to the first word line at least one time when the write command is one of an n1-th write command to an n2-th write command corresponding to the memory transistor, each of the n1 and n2 being a natural number, n2 being greater than n1, and
execute a second write sequence including a second program operation of applying a second program voltage to the first word line at least one time when the write command is one of an (n2+1)-th write command to an n3-th write command corresponding to the memory transistor, n3 being a natural number greater than n2, wherein the corresponding second program voltage in a k-th one of the second program operations of the second write sequence is less than the corresponding first program voltage in a k-th one of the first program operations in the first write sequence, k being a natural number, wherein when at least one of the first write sequence or the second write sequence is executed m times, wherein m, a natural number, corresponds to a maximum number of times of the first program operation or the second program operation, and wherein an average value of the second program voltage from a first second program operation to an m-th second program operation of the second write sequence is less than an average value of first program voltage from a first first program operation to an m-th first program operation of the first write sequence.

2. A semiconductor memory device comprising:
a memory transistor having a gate electrode;
a word line connected to the gate electrode of the memory transistor;
a peripheral circuit connected to the word line; and
a plurality of electrodes connected to the peripheral circuit and configured to receive data input and provide data output, wherein
the peripheral circuit is configured to:
execute, in response to a first write command via the plurality of electrodes, a first write sequence including a first program operation of applying a first program voltage to the word line at least one time, and
execute, in response to a second write command via the plurality of electrodes, a second write sequence including a second program operation of applying a second program voltage to the word line at least one time, wherein
the corresponding second program voltage in a k-th one of the second program operations of the second write sequence is less than the corresponding first program voltage in a k-th one of the first program operations in the first write sequence, k being a natural number,
wherein when at least one of the first write sequence or the second write sequence is executed for m times, wherein m, a natural number, corresponds to a maximum number of times of the first program operation or the second program operation,
and wherein an average value of the second program voltage from a first second program operation to an m-th second program operation of the second write sequence is less than an average value of first program voltage from a first first program operation to an m-th first program operation of the first write sequence.

3. The semiconductor memory device according to claim 1, wherein
the peripheral circuit is further configured to:
execute a first verification operation of applying a first verification voltage to the first word line at least one time in the first write sequence, and
execute a second verification operation of applying a second verification voltage to the first word line at least one time in the second write sequence,
wherein in the first verification operation, only one kind of first verification voltage is supplied to the first word line, and in the second verification operation, only one kind of second verification voltage is supplied to the first word line.

4. The semiconductor memory device according to claim 1, further comprising:
a plurality of memory chips;
a controller chip connected to the memory chips; and
a controller connected to the controller chip, wherein
the plurality of memory chips each includes a plurality of memory blocks and the peripheral circuit, and the plurality of memory blocks each includes a plurality of memory transistors and a plurality of word lines,
at least one of the plurality of memory chips, the controller chip or the controller includes a first storage unit,
wherein the first storage unit is configured to:
store a minimum value, a maximum value, or a value therebetween of a number of execution times of the first write sequence, the second write sequence, or an erase sequence that has been performed on the plurality of memory transistors in each of the plurality of memory chips.

5. The semiconductor memory device according to claim 1, further comprising:
a plurality of memory chips;
a controller chip connected to the memory chips; and
a controller connected to the controller chip, wherein
the plurality of memory chips each includes a plurality of memory blocks and the peripheral circuit, and the plurality of memory blocks each includes a plurality of memory transistors and a plurality of word lines,
at least one of the plurality of memory chips, the controller chip or the controller includes a first storage unit,
wherein the first storage unit is configured to:
store a minimum value, a maximum value or a value therebetween of a number of execution times of the first write sequence, the second write sequence, or an erase sequence that has been performed on the plurality of memory transistors in the memory chip.

6. The semiconductor memory device according to claim 1, further comprising:
a plurality of memory chips;
a controller chip connected to the memory chips; and
a controller connected to the controller chip, wherein
the plurality of memory chips each includes a plurality of memory blocks and the peripheral circuit, and the plurality of memory blocks each includes a plurality of memory transistors and a plurality of word lines,
at least one of the plurality of memory chips, the controller chip or the controller includes a first storage unit,
wherein the first storage unit is configured to:
store a minimum value, a maximum value or a value therebetween of a number of execution times of the first write sequence, the second write sequence, or an erase sequence that has been performed on the plurality of memory transistors in each of the memory blocks of each of the plurality of memory chips.

7. The semiconductor memory device according to claim 3, wherein the first memory transistor is a single level cell.

8. A semiconductor memory device comprising:
a first memory transistor having a gate electrode;
a first word line connected to the gate electrode of the first memory transistor;
a peripheral circuit connected to the first word line; and
a plurality of electrodes connected to the peripheral circuit and configured to receive data input and provide data output, wherein in response to a write command via the plurality of electrodes, the peripheral circuit is configured to:

execute a first write sequence including a first program operation of applying a program voltage to the first word line at least one time when the write command is one of an n1-th write command to an n2-th write command corresponding to the memory transistor, each of the n1 and n2 being a natural number, n2 being greater than n1, and execute a second write sequence including a second program operation of applying a program voltage to the first word line at least one time when the write command is one of an (n2+1)-th write command to an n3-th write command corresponding to the memory transistor, n3 being a natural number greater than n2, wherein in the first write sequence, a first difference voltage is a difference between a first program voltage and a second program voltage, the first program voltage being a voltage applied to the word line in a k-th first program operation and the second program voltage being a voltage applied to the word line in a (K+1)-th first program operation voltage, wherein in the second write sequence, a second difference voltage is a difference between a third program voltage and a fourth program voltage, the third program voltage being a voltage applied to the word line in a k-th second program operation and the fourth program voltage being a voltage applied to the word line in a (K+1)-th second program operation voltage, and wherein the first difference voltage is larger than the second difference voltage.

9. The semiconductor memory device according to claim 8, wherein the first program voltage is larger than the third program voltage.

10. The semiconductor memory device according to claim 8, wherein the peripheral circuit is further configured to:

execute a first verification operation of applying only a first verification voltage to the first word line at least one time in the first write sequence, and execute a second verification operation of applying only a second verification voltage to the first word line at least one time in the second write sequence.

11. The semiconductor memory device according to claim 10, wherein the second verification voltage is substantially the same as the first verification voltage.

12. The semiconductor memory device according to claim 10, wherein the first memory transistor is a single level cell.

13. The semiconductor memory device according to claim 8, wherein a storage unit is configured to:

store a number of execution times the first write sequence.

14. The semiconductor memory device according to claim 8, wherein the storage unit is configured to:

store a number of execution times an erase sequence.

15. The semiconductor memory device according to claim 14, wherein the peripheral circuit is further configured to:

execute to the first write sequence or the second write sequence according to the number of a number of execution times the erase sequence.

* * * * *